US012801806B2

(12) United States Patent
Wang et al.

(10) Patent No.: US 12,801,806 B2
(45) **Date of Patent: *Nov. 17, 2026**

(54) SCALABLE SYSTEM AND METHOD FOR FORECASTING WIND TURBINE FAILURE USING SCADA ALARM AND EVENT LOGS

(71) Applicant: Utopus Insights, Inc., Valhalla, NY (US)

(72) Inventors: Yajuan Wang, White Plains, NY (US); Younghun Kim, Pleasantville, NY (US)

(73) Assignee: Utopus Insights, Inc., Valhalla, NY (US)

( * ) Notice: Subject to any disclaimer, the term of this patent is extended or adjusted under 35 U.S.C. 154(b) by 1002 days.

This patent is subject to a terminal disclaimer.

(21) Appl. No.: 17/457,029

(22) Filed: Nov. 30, 2021

(65) Prior Publication Data

US 2022/0245297 A1 Aug. 4, 2022

Related U.S. Application Data

(63) Continuation of application No. 16/231,122, filed on Dec. 21, 2018, now Pat. No. 11,188,691.

(51) Int. Cl.
*G06F 30/20* (2020.01)
*F03D 7/04* (2006.01)
(Continued)

(52) U.S. Cl.
CPC ............ *G06F 30/20* (2020.01); *G06N 20/00* (2019.01); *F03D 7/045* (2013.01);
(Continued)

(58) Field of Classification Search
None
See application file for complete search history.

(56) References Cited

U.S. PATENT DOCUMENTS 10,401,270 B2 9/2019 Castaneda et al.
10,540,377 B2 1/2020 Li et al.
(Continued)

OTHER PUBLICATIONS

Kusiak, A., and Verma, A. (Jan. 28, 2011). "Prediction of Status Patterns of Wind Turbines: A Data-Mining Approach." ASME. J. Sol. Energy Eng. Feb. 2011; 133(1): 011008 (Year: 2011).*
(Continued)

*Primary Examiner* — Aniss Chad
(74) *Attorney, Agent, or Firm* — Ahmann Kloke LLP

(57) ABSTRACT

An example method comprises receiving event and alarm data from event logs, failure data, and asset data from SCADA system(s), retrieve patterns of events from the SCADA data, receiving historical sensor data from sensors of components of wind turbines, training a set of models to predict faults for each component using the patterns of events and historical sensor data, each model of a set having different observation time windows and lead time windows, evaluating each model of a set using standardized metrics, comparing evaluations of each model of a set to select a model with preferred lead time and accuracy, receive current sensor data from the sensors of the components, apply the selected model(s) to the current sensor data to generate a component failure prediction, compare the component failure prediction to a threshold, and generate an alert and report based on the comparison to the threshold.

19 Claims, 22 Drawing Sheets

(51) Int. Cl.

| | |
|---|---|
| ***G05B 23/02*** | (2006.01) |
| ***G06F 11/00*** | (2006.01) |
| ***G06F 17/16*** | (2006.01) |
| ***G06N 20/00*** | (2019.01) |

(52) U.S. Cl.
CPC ........ *G05B 23/0224* (2013.01); *G05B 23/024* (2013.01); *G05B 23/0275* (2013.01); *G05B 2219/2619* (2013.01); *G06F 11/008* (2013.01); *G06F 17/16* (2013.01)

(56) References Cited

U.S. PATENT DOCUMENTS

| | | | | |
|---|---|---|---|---|
| 2011/0046842 | A1* | 2/2011 | Smith .................... | G07C 5/006 701/31.4 |
| 2013/0184838 | A1 | 7/2013 | Tchoryk et al. | |
| 2013/0232094 | A1* | 9/2013 | Anderson .......... | G05B 23/0281 706/12 |
| 2016/0153806 | A1* | 6/2016 | Ciasulli ............... | G01M 99/005 702/183 |
| 2018/0320658 | A1* | 11/2018 | Herzog ................... | F03D 7/045 |
| 2019/0003929 | A1 | 1/2019 | Shapiro et al. | |
| 2019/0087256 | A1 | 3/2019 | Horrell et al. | |
| 2019/0317952 | A1 | 10/2019 | Li et al. | |
| 2020/0067969 | A1 | 2/2020 | Abbaszadeh et al. | |
| 2020/0103886 | A1* | 4/2020 | Gandenberger ... | G05B 23/0283 |
| 2020/0141392 | A1 | 5/2020 | Damgaard et al. | |

OTHER PUBLICATIONS

Zhao, Y., Li, D., Dong, A., Kang, D., Lv, Q., & Shang, L. (2017). Fault Prediction and Diagnosis of Wind Turbine Generators Using SCADA Data. Energies, 10(8), 1210 (Year: 2017).*

* cited by examiner

* The curvature analysis can be done for all the performance metrics

Event Log Example →

| TurbineId | EventCodeNumber | TurbineEventType | EventStartUTC | EventStopedUTC | Description | TurbineEventID | Param1 | Param2 |
|---|---|---|---|---|---|---|---|---|
| 30367 | 265 | O | 11/30/17 23:11 | 12/1/17 0:11 | Wind:7.6 m/s Gen:1560.4 RPM | 8857407920 | 76 | 15604 |
| 30367 | 266 | O | 11/30/17 23:11 | 12/1/17 0:11 | Pitch: -2.1° Power: 672.3 kW | 8857407921 | -21 | 6723 |
| 30367 | 442 | O | 11/30/17 23:28 | 12/1/17 0:28 | Remote power setpoint 2000kW | 8858033305 | 2000 | 0 |
| 30367 | 115 | O | 11/30/17 23:31 | 12/1/17 0:31 | Generator 1 out | 8857882705 | 1 | 0 |

FIG. 15a

| EventDescription | EventCode |
|---|---|
| CapTest Capacitor deterioration | 434 |
| Elec PwrFluctuations | 432 |
| Pitch ExternSafetyRun Input High TS5 Error | 430 |
| PitchAngle DifferenceStop | 412 |
| SFS Temperature Error Stop | 372 |
| SFS CrowbarCurrent LimitExceeded Stop | 371 |

← Event Meta Data Example

FIG. 15b

| EventDescription | EventCode | fid |
|---|---|---|
| Temp ControlPanel LowStop | 193 | 190 |
| Elec VoltageU1 HighStop | 194 | 191 |
| Elec VoltageU2 HighStop | 195 | 192 |
| Elec VoltageU3 HighStop | 196 | 193 |
| Elec VoltageU1 LowStop | 197 | 194 |
| Elec VoltageU2 LowStop | 198 | 195 |
| Elec VoltageU3 LowStop | 199 | 196 |
| Elec ParkControlActive | 201 | 197 |

FIG. 16

| Instance ID | FID:0 | ... | FID: 190 | FID: 191 | ... |
|---|---|---|---|---|---|
| ... | | | | | |
| 28 | 3000 | | 29450 | 1234 | |
| 29 | 2401 | | 15000 | 2930 | |
| ... | | | | | |

FIG. 17

| | Training Data* | Cross-Validation Data (10-fold) | Testing Data* |
|---|---|---|---|
| Area Under the Curve (AUC) | 93% | 83.8% (±13.7%) | 66% |
| Accuracy | 82% | 70% (±14.9%) | 65% |
| Precision | 74% | 70% (±16.7%) | 60% |
| Recall | 100% | 75% (±15.3%) | 90% |
| Specificity | 65% | 65% (±16.0%) | 40% |

FIG. 20

| Asset Id | Component Name | Update Time | Risk Score of Failure | Forecast Lead Time | Indicator |
|---|---|---|---|---|---|
| 303056 | Generator | 2018-07-11 | 83% | 14 days | Failure |
| 303056 | Gearbox | 2018-07-11 | 23% | 28 days | Okay |
| ... | ... | ... | ... | ... | ... |
| 303060 | Generator | 2018-07-11 | 60% | 14 days | Failure |

FIG. 21

| feature_description | fid | importance_score |
|---|---|---|
| Mech SoftBrake TimeOut | 61 | 0.070686 |
| Rep Pitch EmergencyRun | 289 | 0.066005 |
| Temp G1L3 HighWarn | 25 | 0.064999 |
| Elec FrequencyLowStopAverage | 57 | 0.061345 |
| Elec CutintoG1 TimeOutStop | 87 | 0.059135 |
| Hyd MaxSystemPressure Detected | 118 | 0.053702 |
| RS YawCCW Manual | 259 | 0.048883 |
| Temp Nacelle HighStop | 40 | 0.044286 |
| Elec TestAkkuPitch TimeOutStop | 89 | 0.041141 |
| Hyd GearOilPressure LowStop | 54 | 0.040005 |
| Pitch LubricationStop | 140 | 0.035610 |
| Mech GearOilOffFilter ChokedWarn | 55 | 0.035442 |
| Temp OilSump HighStop | 32 | 0.034112 |
| Mech RotorLockedStop | 219 | 0.033323 |
| RS Pitch manual | 245 | 0.030388 |

FIG. 22

SCALABLE SYSTEM AND METHOD FOR FORECASTING WIND TURBINE FAILURE USING SCADA ALARM AND EVENT LOGS

CROSS-REFERENCE TO RELATED APPLICATIONS

This application is a continuation of U.S. patent application Ser. No. 16/231,122, filed on Dec. 21, 2018, and entitled "SCALABLE SYSTEM AND METHOD FOR FORECASTING WIND TURBINE FAILURE USING SCADA ALARM AND EVENT LOGS", which is incorporated herein by reference in its entirety.

FIELD OF THE INVENTION

Embodiments of the present invention(s) relate generally to forecasting failure of renewable energy assets and, in particular, evaluating models to predict failures of one or more renewable energy assets to increase lead time before failure and improve accuracy.

DESCRIPTION OF RELATED ART

Detection and prediction of failure in one or more components of an asset of an electrical network has been difficult. Detection of a failure of a component of an asset is tedious and high in errors. In this example, an asset is a device for generating or distributing power in an electrical network. Examples of assets can include, but is not limited to, a wind turbine, solar panel power generator, converter, transformer, distributor, and/or the like. Given that detection of a failure of a component of an asset may be difficult to determine, increased accuracy of prediction of future failures compounds problems.

SUMMARY

An example nontransitory computer readable medium comprises executable instructions. The executable instructions are executable by one or more processors to perform a method, the method comprising: receiving event and alarm data from event logs of one or more SCADA systems that monitor any number of wind turbines, the event and alarm data being generated during a first period of time, receiving historical wind turbine component failure data and wind turbine asset data from the one or more SCADA systems during the first period of time, creating cohort instances based on the wind turbine failure data and wind turbine asset data, each cohort representing a subset of the wind turbines, the subset of the wind turbines including a same type of controller and a similar geographical location, the geographical location of the wind turbines of the subset of wind turbines being within the wind turbine asset data, generating an event and alarm vendor agnostic representation of the event and alarm data creating a feature matrix, wherein the feature matrix includes a unique feature identifier for each feature of the event and alarm data and one or more features from the event and alarm data, extracting patterns of events based on the feature matrix, receiving first historical sensor data of the first time period, the first historical sensor data including sensor data from one or more sensors of one or more components of the any number of renewable energy assets, the first historical sensor data indicating at least one first failure associated with the one or more components of the renewable energy asset during the first time period, generating a first set of failure prediction models using the first historical sensor data and the patterns of events, each of the first set of failure prediction models being trained using different amounts of first historical sensor data based on different observation time windows and different lead time windows, each observation time window including a time period during which first historical data is generated, the lead time window including a period of time before a predicted failure, evaluating each of the first set of failure prediction models using at least a confusion matrix including metrics for true positives, false positives, true negatives, and false negatives as well as a positive prediction value, comparing the confusion matrix and the positive prediction value of each of the first set of failure prediction models, selecting at least one failure prediction model of the first set of failure prediction models based on the comparison of the confusion matrixes, the positive prediction values, and the lead time windows to create a first selected failure prediction model, the first selected failure prediction model including the lead time window before a predicted failure, receiving first current sensor data of a second time period, the first current sensor data including sensor data from the one or more sensors of the one or more components of the renewable energy asset, applying the first selected failure prediction model to the current sensor data to generate a first failure prediction a failure of at least one component of the one or more components, comparing the first failure prediction to a trigger criteria, and generating and transmitting a first alert based on the comparison of the failure prediction to the trigger criteria, the alert indicating the at least one component of the one or more components and information regarding the failure prediction.

In some embodiments, the method further comprises cleaning of the event and alarm data from the event logs, the cleaning comprising discarding event data missing expected information. Extracting patterns of events based on the feature matrix may comprise counting a number of event codes of events that occurred during a time interval using the feature matrix and sequence the event codes to include dynamics of events in a longitudinal time dimension. The time interval may be the time period, the first historical sensor data being generated by the one or more sensors during the time period. Events of the patterns of events may occur during the time period. The renewable energy asset may be a wind turbine. The first historical sensor data may be the historical wind turbine component failure data.

The method may further comprise retrieving the trigger criteria from a datastore including a plurality of trigger criteria, the trigger criteria being retrieved based at least in part on the at least one component of the one or more components. In some embodiments, the method further comprises receiving operational signals from the one or more SCADA systems and extracting features from the operational signals, wherein generating the first set of failure prediction models uses the first historical sensor data, the patterns of events, and extracted features rom the operational signals.

An example system may comprise at least one processor and memory containing instructions, the instructions being executable by the at least one processor to: receive event and alarm data from event logs of one or more SCADA systems that monitor any number of wind turbines, the event and alarm data being generated during a first period of time, receive historical wind turbine component failure data and wind turbine asset data from the one or more SCADA systems during the first period of time, create cohort instances based on the wind turbine failure data and wind turbine asset data, each cohort representing a subset of the wind turbines, the subset of the wind turbines including a same type of controller and a similar geographical location, the geographical location of the wind turbines of the subset of wind turbines being within the wind turbine asset data, generate an event and alarm vendor agnostic representation of the event and alarm data creating a feature matrix, wherein the feature matrix includes a unique feature identifier for each feature of the event and alarm data and one or more features from the event and alarm data, extract patterns of events based on the feature matrix, receive first historical sensor data of the first time period, the first historical sensor data including sensor data from one or more sensors of one or more components of the any number of renewable energy assets, the first historical sensor data indicating at least one first failure associated with the one or more components of the renewable energy asset during the first time period, generate a first set of failure prediction models using the first historical sensor data and the patterns of events, each of the first set of failure prediction models being trained using different amounts of first historical sensor data based on different observation time windows and different lead time windows, each observation time window including a time period during which first historical data is generated, the lead time window including a period of time before a predicted failure, evaluate each of the first set of failure prediction models using at least a confusion matrix including metrics for true positives, false positives, true negatives, and false negatives as well as a positive prediction value, compare the confusion matrix and the positive prediction value of each of the first set of failure prediction models, select at least one failure prediction model of the first set of failure prediction models based on the comparison of the confusion matrixes, the positive prediction values, and the lead time windows to create a first selected failure prediction model, the first selected failure prediction model including the lead time window before a predicted failure, receive first current sensor data of a second time period, the first current sensor data including sensor data from the one or more sensors of the one or more components of the renewable energy asset, apply the first selected failure prediction model to the current sensor data to generate a first failure prediction a failure of at least one component of the one or more components, compare the first failure prediction to a trigger criteria, and generate and transmitting a first alert based on the comparison of the failure prediction to the trigger criteria, the alert indicating the at least one component of the one or more components and information regarding the failure prediction.

An example method comprises receiving event and alarm data from event logs of one or more SCADA systems that monitor any number of wind turbines, the event and alarm data being generated during a first period of time, receiving historical wind turbine component failure data and wind turbine asset data from the one or more SCADA systems during the first period of time, creating cohort instances based on the wind turbine failure data and wind turbine asset data, each cohort representing a subset of the wind turbines, the subset of the wind turbines including a same type of controller and a similar geographical location, the geographical location of the wind turbines of the subset of wind turbines being within the wind turbine asset data, generating an event and alarm vendor agnostic representation of the event and alarm data creating a feature matrix, wherein the feature matrix includes a unique feature identifier for each feature of the event and alarm data and one or more features from the event and alarm data, extracting patterns of events based on the feature matrix, receiving first historical sensor data of the first time period, the first historical sensor data including sensor data from one or more sensors of one or more components of the any number of renewable energy assets, the first historical sensor data indicating at least one first failure associated with the one or more components of the renewable energy asset during the first time period, generating a first set of failure prediction models using the first historical sensor data and the patterns of events, each of the first set of failure prediction models being trained using different amounts of first historical sensor data based on different observation time windows and different lead time windows, each observation time window including a time period during which first historical data is generated, the lead time window including a period of time before a predicted failure, evaluating each of the first set of failure prediction models using at least a confusion matrix including metrics for true positives, false positives, true negatives, and false negatives as well as a positive prediction value, comparing the confusion matrix and the positive prediction value of each of the first set of failure prediction models, selecting at least one failure prediction model of the first set of failure prediction models based on the comparison of the confusion matrixes, the positive prediction values, and the lead time windows to create a first selected failure prediction model, the first selected failure prediction model including the lead time window before a predicted failure, receiving first current sensor data of a second time period, the first current sensor data including sensor data from the one or more sensors of the one or more components of the renewable energy asset, applying the first selected failure prediction model to the current sensor data to generate a first failure prediction a failure of at least one component of the one or more components, comparing the first failure prediction to a trigger criteria, and generating and transmitting a first alert based on the comparison of the failure prediction to the trigger criteria, the alert indicating the at least one component of the one or more components and information regarding the failure prediction.

BRIEF DESCRIPTION OF THE DRAWINGS

FIG. 15*a* depicts an example event log.

FIG. 15*b* depicts an example alarm metadata.

FIG. 16 depicts an example feature matrix generated by the longitudinal event and alarm pattern extraction module in some embodiments.

FIG. 17 depicts an example longitudinal pattern extraction matrix that identifies for each instance identifier a number that each unique feature identifier occurs in a period of time.

FIG. 20 depicts an example retrospective model evaluation performance depiction in some embodiments.

FIG. 21 depicts a prospective component failure forecasting risk score and action urgency depiction in some embodiments.

FIG. 22 depicts selected event code longitudinal patterns in one example.

DETAILED DESCRIPTION

In the wind and solar generation industry, it is crucial to accurately forecast component failures with as much lead time as possible. Some embodiments described herein utilize machine learning algorithms to build a sophisticated forecasting model based on multi-variate sensor data to forecast component failures. There is typically a trade-off between accuracy of the forecast of component failure and the length of time forecasted (e.g., the predicted length of time) before the failure occurs. As a result, there is a need to generate multiple models for evaluation and standardize evaluation in order to obtain models that accurately predict failure at an acceptable length of time prior to the predicted failure. Various embodiments described herein overcome limitations of the prior art including scalability, proactive warnings, and computational efficiency while providing improved accuracy.

Historically, after models are created, they are evaluated using historical data in order to compare output against known truth. Without a standard set of metrics including qualitative judgments such as false positives and true negatives, different metrics for different components of a system train substandard models. Such models will make failure prediction inconsistent, particularly across different systems. Ill-defined accuracy of a model can lead to "performance metric engineering" (e.g., stating that a model is accurate forecasting per "up to 30 days of prediction" term when the model only predicts a failure 1 day prior to the failure).

Without a standard set of metrics including qualitative judgments, it is increasingly difficult to generate different models and evaluate the models for different windows of lead time prior to the predicted fault with a satisfactory degree of accuracy of the prediction. It will be appreciated that the longer that faults are predicted in the future, the more useful those predictions can be. The longer prediction time however impacts accuracy of the prediction. As such, prediction models need to be evaluated to provide acceptable lead time with the an acceptable level of accuracy. In order to accomplish this consistently across many different components of many different renewable energy assets, a standard set of metrics should be used.

In some embodiments, model performance evaluation may be used to measure the success of different prediction models and, as a result, provide a framework for users to make an educated decision on failure prediction.

It will be appreciated that improving the accuracy and standardization of failure prediction models for components of renewable energy assets improves model creation, evaluation of model performance of the past, and improves scalability (all of which are inherent in the field of computer technology).

Figure 1:
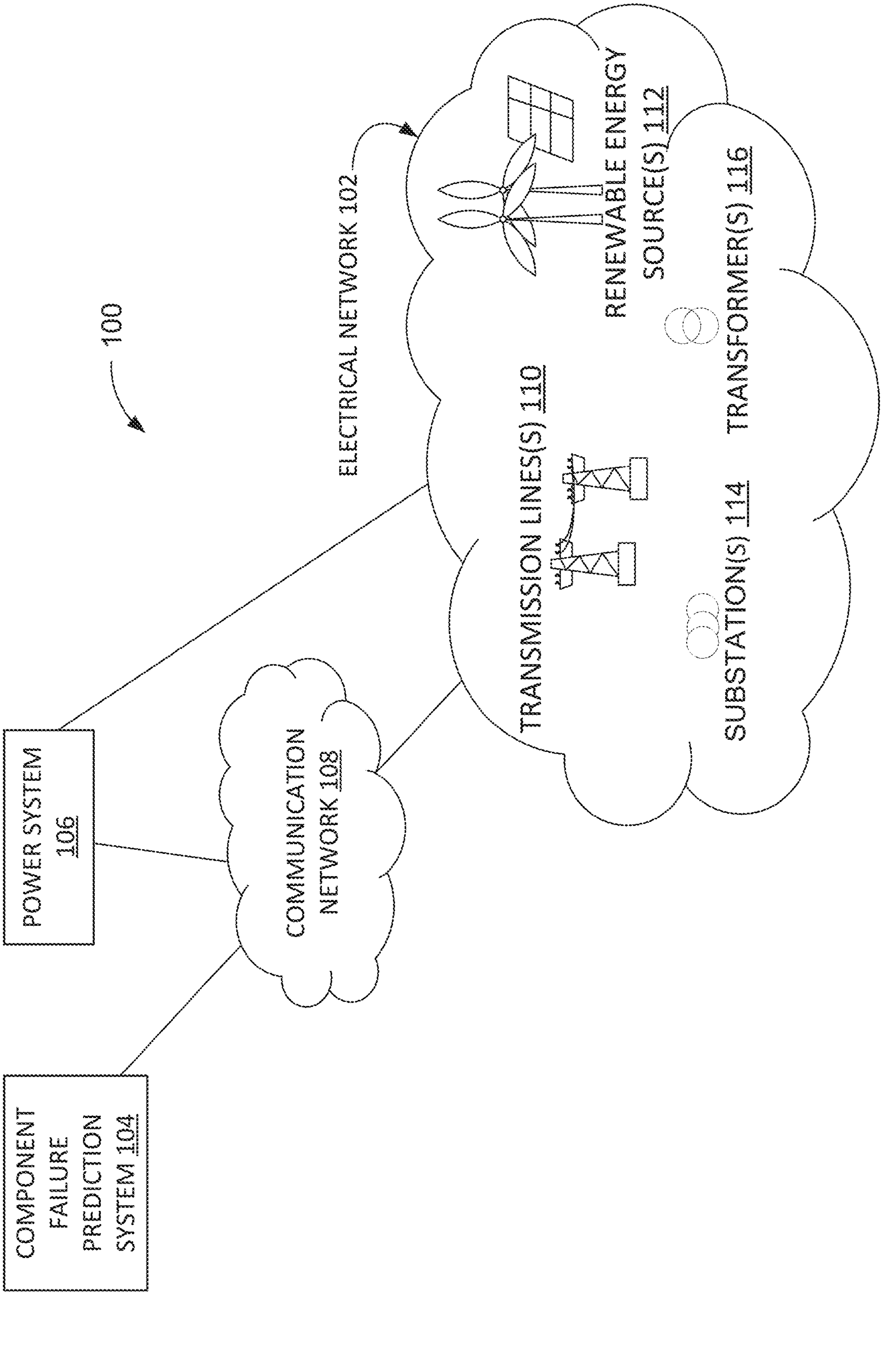
FIG. 1 depicts a block diagram of an example of an electrical network in some embodiments.

FIG. 1 depicts a block diagram 100 of an example of an electrical network 100 in some embodiments. FIG. 1 includes an electrical network 102, a component failure prediction system 104, a power system 106, in communication over a communication network 108. The electrical network 102 includes any number of transmission lines 110, renewable energy sources 112, substations 114, and transformers 116. The electrical network 102 may include any number of electrical assets including protective assets (e.g., relays or other circuits to protect one or more assets), transmission assets (e.g., lines, or devices for delivering or receiving power), and/or loads (e.g., residential houses, commercial businesses, and/or the like).

Components of the electrical network 102 such as the transmission line(s) 110, the renewable energy source(s) 112, substation(s) 114, and/or transformer(s) 106 may inject energy or power (or assist in the injection of energy or power) into the electrical network 102. Each component of the electrical network 102 may be represented by any number of nodes in a network representation of the electrical network. Renewable energy sources 112 may include solar panels, wind turbines, and/or other forms of so called "green energy." The electrical network 102 may include a wide electrical network grid (e.g., with 40,000 assets or more).

Each electrical asset of the electrical network 100 may represent one or more elements of their respective assets. For example, the transformer(s) 116, as shown in FIG. 1 may represent any number of transformers which make up electrical network 100.

In some embodiments, the component failure prediction system 104 may be configured to receive historical sensor data from any number of sensors of any number of electrical assets. The component failure prediction system 104 may subsequently generate any number of models to predict failures of any number of components. Different models for the same component(s) may be generated based on a common set of metrics.

Each model may be evaluated to determine accuracy of the model and the length of time prior to predicted failure at the desired level of accuracy. As such, the component failure prediction system 104 may be used to generate and evaluate multiple models using the same historical sensor data but each with different lengths of time prior to predicted failure in order to identify at least one model with an acceptable accuracy at an acceptable prediction time before component failure is expected to occur.

In some embodiments, communication network 108 represents one or more computer networks (e.g., LAN, WAN, and/or the like). Communication network 108 may provide communication between any of the congestion mitigation system 104, the power system 106, and/or the electrical network 102. In some implementations, communication network 108 comprises computer devices, routers, cables, uses, and/or other network topologies. In some embodiments, communication network 108 may be wired and/or wireless. In various embodiments, communication network 108 may comprise the Internet, one or more networks that may be public, private, IP-based, non-IP based, and so forth.

The component failure prediction system 104 may include any number of digital devices configured to forecast component failure of any number of components and/or generators (e.g., wind turbine or solar power generator) of the renewable energy sources 112.

The power system 106 may include any number of digital devices configured to control distribution and/or transmission of energy. The power system 106 may, in one example, be controlled by a power company, utility, and/or the like. A digital device is any device with at least one processor and memory. Examples of systems, environments, and/or configurations that may be suitable for use with system include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

A computer system may be described in the general context of computer system executable instructions, such as program modules, being executed by a computer system. Generally, program modules may include routines, programs, objects, components, logic, data structures, and so on that perform particular tasks or implement particular abstract data types. A digital device, such as a computer system, is further described with regard to FIG. 24.

Figure 2:
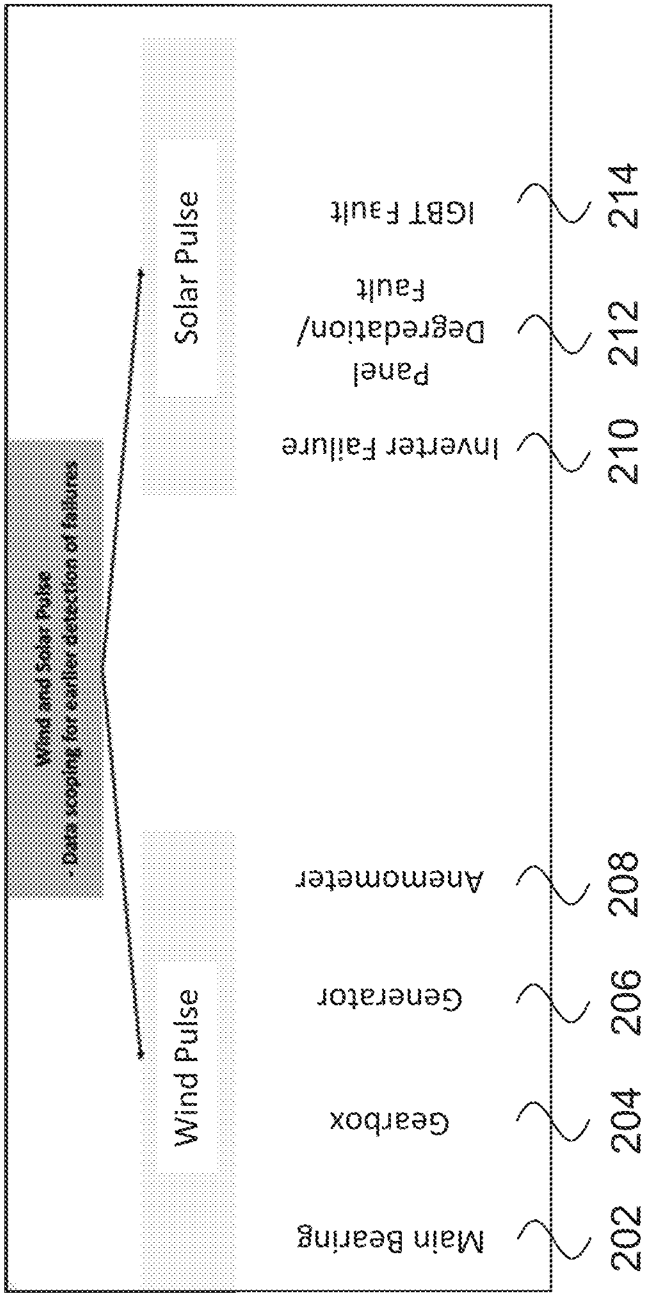
FIG. 2 depicts components that often produce failures of wind turbines and components that often produce failures in solar panel generators.

FIG. 2 depicts components that often produce failures of wind turbines and components that often produce failures in solar panel generators. Failures in wind turbines often occur as a result of failures in a main bearing 202, gearbox 204, generator 206, or anemometer 208. Failures in solar panel generators often occur as a result of failures in an inverter 210, panel degradation 212, and an IGBT 214.

A wind turbine has many potential components of failure. Different sensors may provide different readings for one or more different components or combinations of components. Given the number of wind turbines in a wind farm, the amount of data to be assessed may be untenable using prior art methods. For example, data analytics systems of the prior art do not scale, sensors provide too much data to be assessed by the prior art systems, and there is a lack of computational capacity in prior art systems to effectively assess data from wind farms in a time sensitive manner. As a result, prior art systems are reactive to existing failures rather than proactively providing reports or warnings of potential future failure of one or more components.

For example, various embodiments regarding a wind turbine described herein may identify potential failure of a main bearing 202, gearbox 204, generator 206, or anemometer 208 of one or more wind turbines. Although many bearings may be utilized in a wind turbine (e.g., yaw and pitch bearings), the main shaft and gearbox of the wind turbine tend to be the most problematic. For example, a main bearing 202 may fail due to high thrust load or may fail due to inadequate lubricant film generation. Trends in redesign of a main shaft 202 and/or gearbox 204 of a single wind turbine have been driven by unexpected failures in these units. The unplanned replacement of main-shaft bearing 202 can cost operators up to $450,000 and have an obvious impact on financial performance.

Gearbox 204 failures are one of the largest sources of unplanned maintenance costs. Gearbox 204 failures can be caused by design issues, manufacturing defects, deficiencies in the lubricant, excessive time at standstill, high loading, and other reasons. There may be many different modes of gearbox 204 failure and, as such, it may be important to identify the type of failure mode in addressing the failure. One mode is micropitting which occurs when lubricant film between contacting surfaces in a gearbox 204 is not thick enough. Macropitting occurs when contact stress in a gear or breaking exceeds the fatigue strength of the material. Bending fatigue a failure mode that affects gear teeth and axial cracking may occur in bearings of a gearbox; the cracks develop in the axial direction, perpendicular to the direction of rolling.

The generator 206 typically converts the wind energy to electrical energy. Failures often occur in bearings, stator, rotor, or the like which can lead to inconsistent voltage to total failure. Generator 206 failure may be difficult to detect as a result of inconsistent weather, lack of motion, and/or partial failure of the anemometer 208.

The anemometer 208 uses moving parts as sensors. Anemometers 208 often include "cups" for wind speed measurements and a wind vane that uses a "vane tail" for measuring vector change, or wind direction. Freezing weather has caused the "cups" and "vane tail" to lock. If an anemometer 208 under-reports wind speed because of a partial failure, there is an increase in rotor acceleration that indicates a large amount of wind energy is not converted into electrical engineering. Rolling resistance in an anemometer 208 bearings typically increase over time until they seize. Further, if the anemometer 208 is not accurate, the wind turbine will not control blade pitch and rotor speed as needed. Poor or inaccurate measurements by the anemometer 208 will lead to incorrect adjustments and increased fatigue.

Similarly, various embodiments regarding a solar panel generator described herein may identify potential failure of a inverter 210, solar panel 212, and IGBT 214 in one or more solar panels of a solar farm.

A solar inverter 210 is an electrical converter to convert variable direct current from a photovoltaic solar panel 212 into a utility frequency alternating current that can be fed to an electrical grid. Production loses are often attributable to poor performance of inverters 210. Solar inventers 210 may overheat (caused by weather, use, or failure of cooling systems) which can reduce production. Moisture may cause a short circuit which can cause complete or partial failure (e.g., to a minimum "required" isolation level). Further, failure of the solar inverter 210 to restart after gird fault may require manual restarting of the equipment.

The panel 212 refers to the solar or photovoltaic panel. The photovoltaic panel 212 may degrade due to weather, poor cleaning, thermal cycling, damp heat, humidity freezing, and UV exposure. Thermal cycling can cause solder bond failures and cracks. Damp heat has been associated with delamination of encapsulants and corrosion of cells. Humidity freezing can cause junction box adhesion to fail. UV exposure contributes to discoloration and backsheet degradation.

Solar inverters 210 often use insulated gate bipolar transistors (IGBT) 214 for conversion of solar panel 212 output to AC voltage. Failures in the IGBT 214 can be caused by fatigue, corrosion of metallizations, electromigration of metallizations, conductive filament formation, stress driven diffusion voiding, and time dependent dielectric breakdown.

Figure 3:
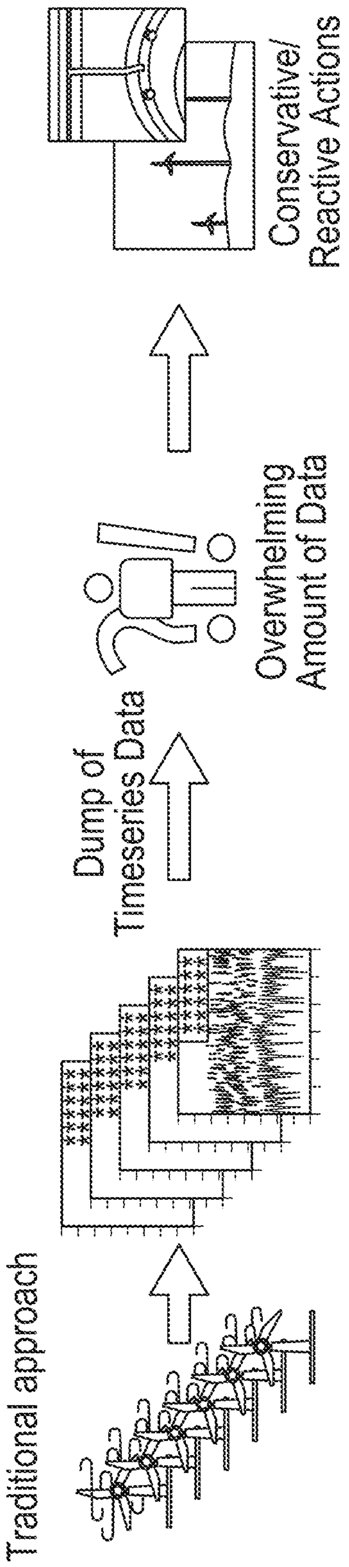
FIG. 3 depicts a common problem of detecting possible failure of one or more components of a wind farm.

FIG. 3 depicts a common problem of detecting possible failure of one or more components of a wind farm. As shown in FIG. 3, there may be any number of wind turbines in a wind farm. Sensors of each wind turbine in a wind farm may generate its own data. As a result, there is a dump of timeseries data which is overwhelming for prior art systems and prior art methods of assessment. As illustrated, monitoring hundreds of assets with hundreds of sensor inputs is time-consuming and overwhelming for operators to test. As a further consequence, evaluating different models for different components to predict failure in those components becomes difficult and accuracy can suffer as the desired time to predict component failure increases.

Existing prior art systems receive too much timeseries data to be effectively assessed in a scalable and/or computationally efficient manner. As a result, there is a conservative and or reactive response to component and wind turbine failure. In other words, action is typically taken well after failure is detected or when failure is both immanent and unmistakable.

Figure 4:
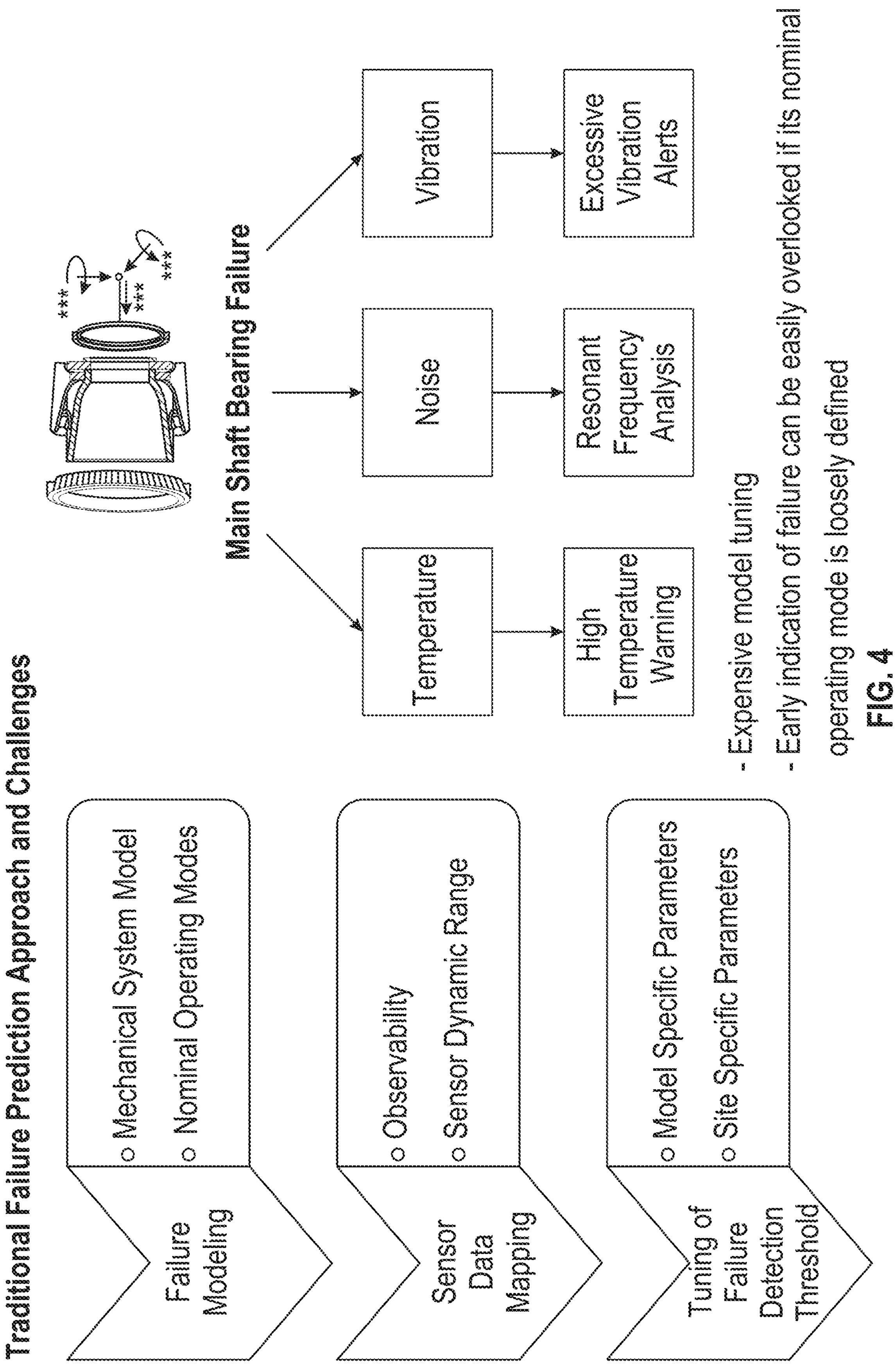
FIG. 4 depicts traditional failure prediction approaches of main shaft bearing failure in wind turbines as well as challenges.

FIG. 4 depicts traditional failure prediction approaches of main shaft bearing failure in wind turbines as well as challenges. In this example, main shaft bearing failure may be caused by any number of components. For prior art analysis, challenges include identifying the correct mechanical systems model and nominal operating modes of that mechanical system model.

Prior art approaches may also fail due to incorrect sensor data mapping. Mapping of sensor data may be based on observability and take into account sensor dynamic range. In this example of the main shaft bearing failure, sensor data regarding temperature, noise, and/or vibration may be taken into account. For example, the sensor data related to temperature, noise, and/or vibration is observed against the background of other sensor data readings, and the sensor dynamic range of each individual sensor or combination of sensors should be recognized.

Prior art systems often fail in tuning a failure detection threshold for a sensor reading. Prior art systems typically must identify model specific parameters and site-specific parameters. In this case the temperature sensor data may indicate a high temperature warning relative to some high temperature threshold. The noise data may be utilized for resonant frequency analysis to detect residents within a component or device. The vibration data may be assessed to determine excessive vibration relative to some vibration threshold.

Further early indication of failures in temperature, noise, vibration, or other failures, can be easily overlooked if it's nominal operating mode is loosely defined by the prior art system.

Figure 5:
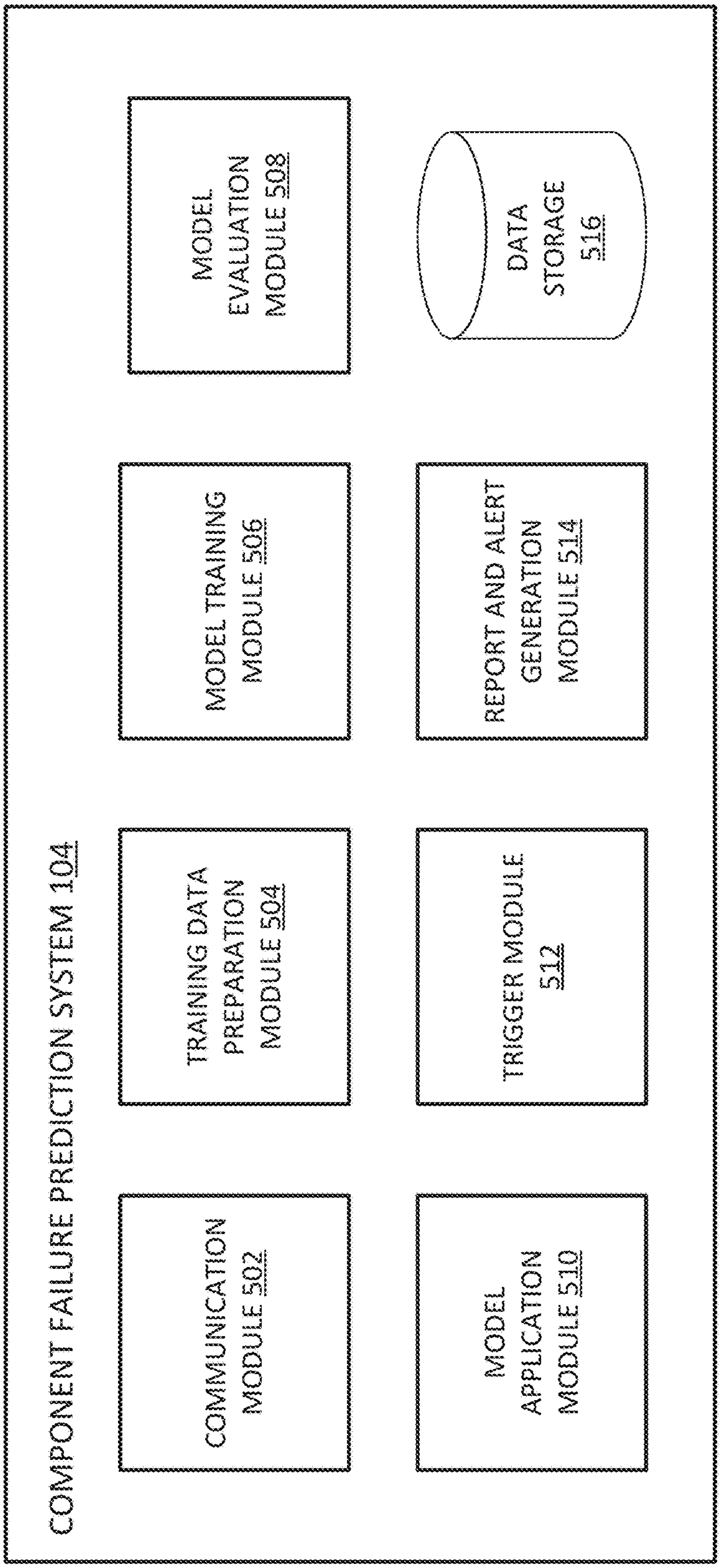
FIG. 5 is a block diagram of a component failure prediction system in some embodiments.

FIG. 5 is a block diagram of a component failure prediction system 104 in some embodiments. The component failure prediction system 104 may predict a component failure ahead of the actual failure. The component failure prediction system 104 may train and evaluate any number of models that predict component failure. In some embodiments, the component failure prediction system 104 trains a set of component failure prediction models for each component or set of components using historical sensor data received from sensors of any number of electrical assets (e.g., including renewable energy electrical assets such as wind turbines). In some embodiments, each set of models predicts failure of a different component of the same or different electrical assets.

The component failure prediction system 104 may train different failure prediction models of a set using the same metrics from historical sensor data but with different lead times and with different amounts of historical sensor data (e.g., different amounts of lookback times). The component failure production system 104 may evaluate the failure prediction models of the set based on sensitivity, precision, and/or specificity for the different lookback and lead times. As a result, the component failure prediction system 104 may select a failure prediction model of a set of failure prediction models for each component type (e.g., bearing), component (e.g., specific bearing(s) in one or more assets), component group type (e.g., generator including two or more components), component group (e.g., specific generator(s) including two or more components in one or more assets), asset type (e.g., wind turbines), or group of assets (e.g., specific set of wind turbines).

Metrics used to evaluate performance (e.g., based on values from sensor readings and/or from the sensors themselves) may be the same for different components even if the sensor data from sensors of the different components is different. By standardizing metrics for evaluation, the component failure prediction system 104 may "tune" or change aspects of the failure prediction model and model training to accomplish the goals of acceptable accuracy with acceptable lead time before the predicted failure. This enable improved accuracy for different components of an electrical assets with improved time of prediction (e.g., longer prediction times is preferable).

In some embodiments, the component failure prediction system 104 may apply a multi-variate anomaly detection algorithm to sensors that are monitoring operating conditions of any number of renewable assets (e.g., wind turbines and or solar generators). The component failure production system 104 may remove data associated with a past, actual failure of the system (e.g. of any number of components and or devices), therefore highlighting subtle anomalies from normal operational conditions that lead to actual failures.

The component failure production system 104 may fine-tune failure prediction models by applying dimensionality reduction techniques to remove noise from irrelevant sensor data (e.g., apply principal component analysis to generate a failure prediction model using linearly uncorrelated data and/or features from the data). For example, the component failure production system 104 may utilize factor analysis to identify the importance of features within sensor data. The component failure production system 104 may also utilize one or more weighting vectors to highlight a portion or subset of sensor data that has high impact on the failure.

In some embodiments, the component failure production system 104 may further scope time series data of the sensor data by removing some sensor data from the actual failure time period. In various embodiments, the component failure production system 104 may optionally utilize curated data features to improve the accuracy of detection. Gearbox failure detection, for example, may utilize temperature rise in the gearbox with regards to power generation, reactive power, and ambient temperature.

In some embodiments, the component failure prediction system 104 may receive historical sensor data regarding renewable energy sources (e.g., wind turbines, solar panels, wind farms, solar farms, electrical grants, and/or the like). The component failure prediction system 104 may break down the data in order to identify important features and remove noise of past failures that may impact model building. The historical data may be curated to further identify important features and remove noise. The component failure prediction system 104 may further identify labels or categories for machine learning. It will be appreciated that component failure prediction system 104 may, in some embodiments, identify labels.

The component failure prediction system 104 may receive sensor data regarding any number of components from any number of devices, such as wind turbines from a wind farm. The sensor data may include multivariate timeseries data which, when in combination with the labels or categories for machine learning, may assist for deep learning, latent variable mining, may provide insights for component failure indication. These insights, which may predict upcoming failures, may effectively enable responses to upcoming failures with sufficient lead time before failure impacts other components of energy generation.

It will be appreciated that identifying upcoming failures for any number of components and renewable energy generation may become increasingly important as sources of energy migrate to renewable energy. Failure of one or more components may impact the grid significantly, and as a result may put the electrical grid, or the legacy components of the electrical grid, either under burden or cause them to fail completely. Further, failures of the electrical grid and/or failures of renewable energy sources may threaten loss of property, business, or life particularly at times where energy is critical (e.g., hospital systems, severe weather conditions such as heat waves, blizzards, or hurricanes, care for the sick, care for the elderly, and/or care of the young).

The component failure prediction system 104 may comprise a communication module 502, a training data preparation module 504, a model training module 506, a model evaluation module 508, a model application module 510, a trigger module 512, a report and alert generation module 514, and a data storage 516.

The communication module 502 may be configured to transmit and receive data between two or more modules in the component failure prediction system 104. In some embodiments, the communication module 502 is configured to receive information regarding assets of the electrical network 102 (e.g., from the power system 106, sensors within components of the electrical network 102 such as the renewable energy sources 112, third-party systems such as government entities, other utilities, and/or the like).

The communication module 502 may be configured to receive historical sensor data regarding electrical assets either individually or in combination (e.g., wind turbines, solar panels, windfarms, solar farms, components of devices, components of wind turbines, components of solar panels, substations 114, transformers 116, and/or transmission lines 110). The communication module 502 may further receive sensor data from one or more sensors of any number of electrical assets such as those described above.

The training data preparation module 504 may optionally prepare the historical sensor data for training failure prediction modules. In various embodiments, the training data preparation module 504 may extract features (e.g., dimensions and/or variables) from the received historical sensor data. The multivariate sensor data may, as discussed herein, be time series data. For example, the training data preparation module 504 may extract features from the time series data. The training data preparation module 504 may provide the extracted features to the model training module 506 for training one or more models.

In various embodiments, feature extraction may also refer to the process of creating new features from an initial set of data. These features may encapsulate central properties of a data set and represent the data set and a low dimensional space that facilitates learning. As can be appreciated, the initial multivariate sensor data may include a number of features that are too large and unwieldy to be effectively managed and may require an unreasonable amount of computing resources. Feature extraction may be used to provide a more manageable representative subset of input variables. It will be appreciated that feature extraction may extract features for the data as well as create new features from the initial set of data.

It will be appreciated that, in some embodiments, dimensions may refer to columns (e.g., features or variables) of the received historical sensor data.

The model training module 506 may utilize classification algorithms for model training. The classifications may include for example SVM, DeepLearning (such as CNN or CHAID). The training model input may include balanced input such as, for example, historical sensor data, extracted features from the historical sensor data, scoped anomaly time series from the historical sensor data and event data, scoped weighted sensor timeseries from the historical sensor data, and/or failure indications. In some embodiments the timeseries data is a matrix where the start time the end time of the timeseries include maximum lead time, minimum lead time, and per desired time horizon (e.g., 45 days to 10 days before an event).

The model training module 506 may generate any number of failure prediction models using the historical sensor data and different configurations for lead time. For example, the model training module 506 may generate different failure prediction models of a set of failure prediction modules using different amounts of historical sensor data (e.g., historical sensor data generated over different time periods) and with different lead lookahead times. The model evaluation module 508 may evaluate any or all of the failure prediction models of each set generated by the model training module 506 to identify a preferred failure prediction model of a set in comparison to the other preferred failure prediction models of a set based on preferred criteria (e.g., longer lead times are preferred).

Figure 6:
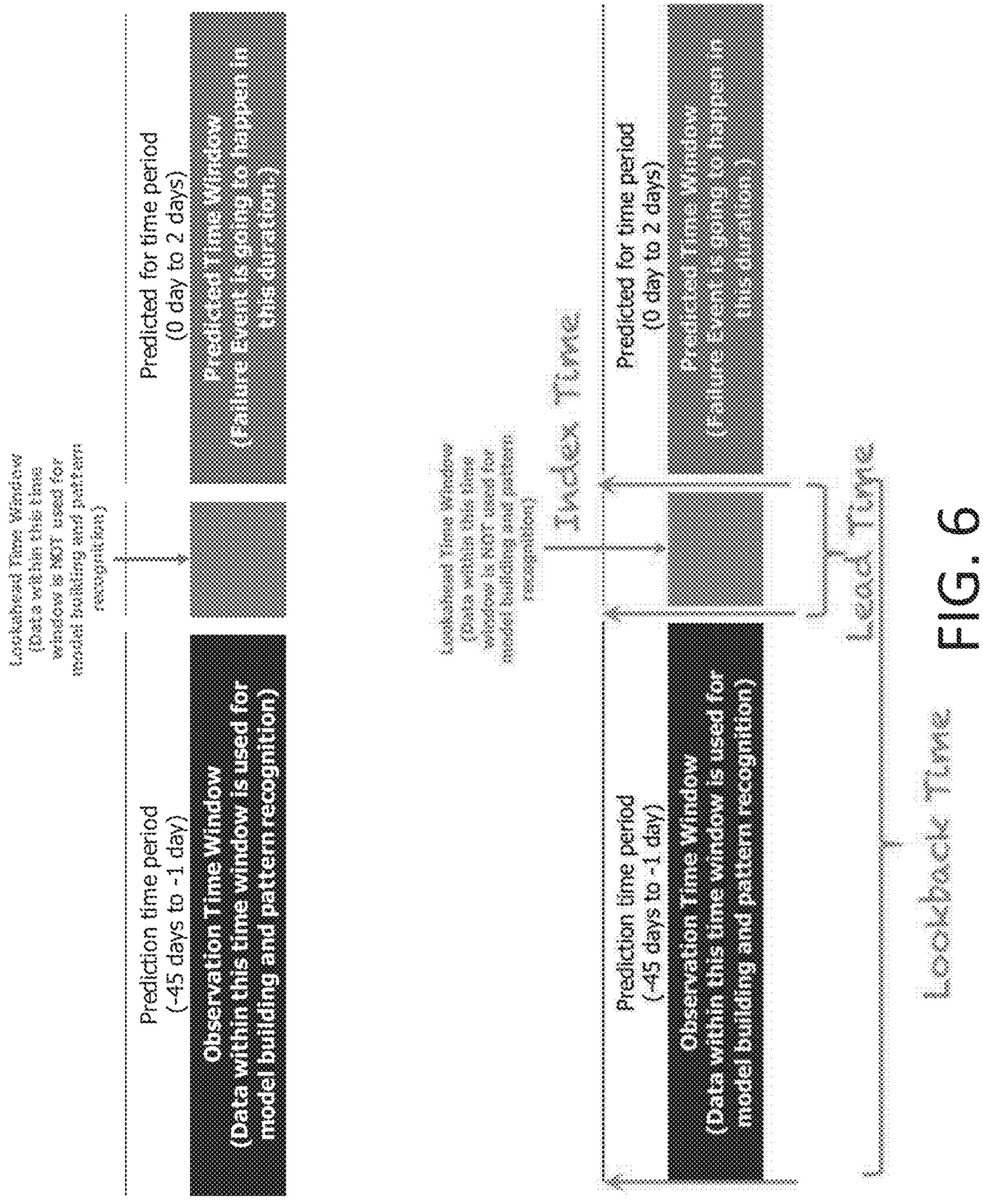
FIG. 6 is an example longitudinal evaluation framework of failure prediction.

FIG. 6 characterizes problems and propose solutions in some embodiments. The graph in FIG. 6 depicts sensor readings from multiple sensors over a period of time leading up to failure. The time before the failure is indicated as "lead time." One goal may be to improve lead time with sufficient accuracy such that alerts may be issued and/or actions taken to mitigate consequences of failure or avoid failure prior to that failure occurring.

FIG. 6 is an example longitudinal evaluation framework of failure prediction. The longitudinal evaluation framework includes three periods of time, including a prediction time period, a lookahead time window, and a predicted for time period. In some embodiments, sensor data received and/or generated during the prediction time period may be used for model building and pattern recognition. Failure event labels may be extracted from the duration of the predicted time window.

The prediction time period is an observation time window where historical sensor data that was generated by sensors during this time window and/or received during this time window is used for failure prediction model building and pattern recognition for different models (e.g., with different amounts of lookback time). The lookahead time window is a period of time when sensor data generated during this time window and/or received during this time window is not used for model building and pattern recognition. In various embodiments, sensor data generated and/or received during the ahead time window may be used to test any or all failure prediction models. The predicted time window is a time period where failure is expected to happen.

In the example of FIG. 6, the prediction time period is −45 days to −1 day (prior to the lookahead time window) and the predicted time window is 0 to 2 days after the lookahead time window. Different failure prediction models may be generated with different amounts of prediction time periods (e.g., different models use a different number of days of sensor data) and different amounts of lookahead times (e.g., different models use a different number of days before predicted failure).

It will be appreciated that the predicted time period may be any length of time prior to the lookahead time window and that the predicted time window can be any length of time after the lookahead time window. One of the goals in some embodiments described herein is to achieve an acceptable level of accuracy of a model with a sufficient lead time before the predicted time window to enable proactive actions to prevent failure, to scale the system to enable detection of a number of component failures, and to improve the accuracy of the system (e.g., to avoid false positives).

Further, as used herein, a model training period may include a time period used to select training instances. An instance is a set of time series/event features along with the failure/non-failure of a particular component in a renewable energy asset (e.g., a wind turbine) in a specified time period. A model testing period is a time period used to select testing instances.

In some embodiments, a balanced input may require a minimum of failure history (e.g., 20%) which can be copied by subsampling the non-failure history and by boosting the failure history data (e.g., sliding window for the failure history data).

In various embodiments, the model training module 506 and/or the training data preparation module 504 may filter the historical sensor data to extract data related to a single component, a type of component, or specific combination of components. The model training module 506 may generate specific failure prediction models (e.g., a set of failure prediction models) for each component, type of component (e.g., rotor, bearing, generator, and the like), specific combination of components, and/or electrical asset. As a result, the model training module 506 may, in some embodiments, generate a plurality of different models for a plurality of different components.

Figure 7:
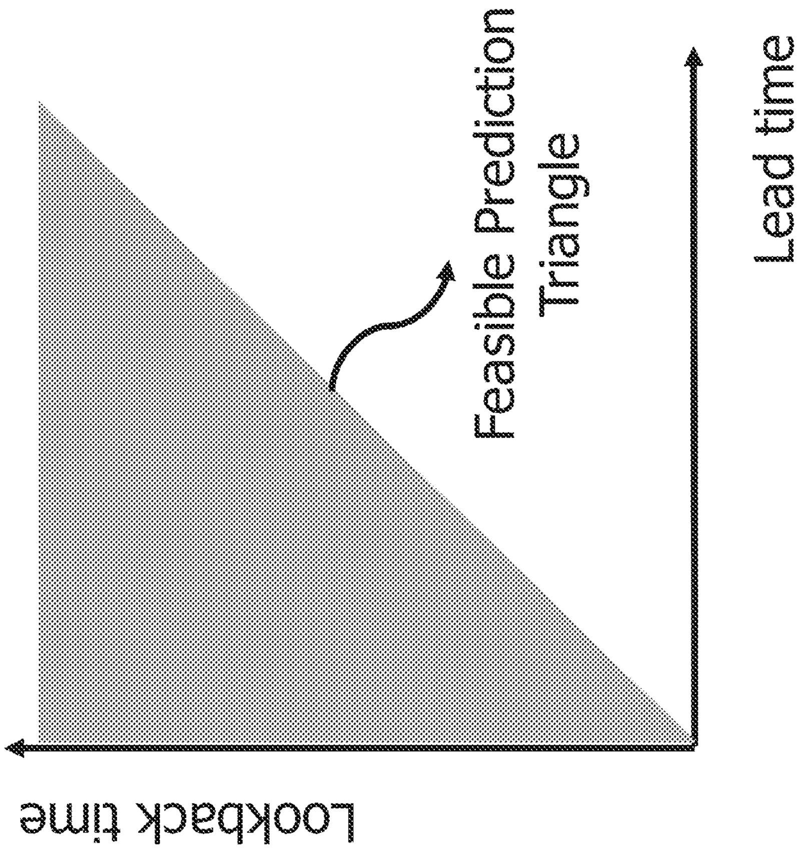
FIG. 7 depicts a graph defining an example feasible prediction triangle as defined by lookback time and lead time

FIG. 7 depicts a graph defining an example feasible prediction triangle as defined by lookback time and lead time. The model training module 506 may define the feasible prediction triangle based on determining a lookback time and a lead time. The feasible prediction triangle may further be utilized for optimization.

In various embodiments, the model training module 506 may identify different lookback times (e.g., different prediction time periods) by evaluating different amounts of historical sensor data and identify different lead time. For example, the component failure prediction system 104 may receive two months of historical sensor data. The component failure prediction system 104 may train a failure prediction model using 45 days of historical sensor data, another failure prediction model of the same set using 40 days of the same sensor historical sensor data, a third failure prediction model of the same set using 35 days of the same sensor historical sensor data, and so forth. Similarly, for any number of failure prediction models, the component failure prediction system 104 may utilize different amounts of lead time thereby defining the feasible prediction triangle differently for each failure prediction model evaluation in order to determine the most preferred model based on time and metric evaluation of performance.

The model evaluation module 508 is configured to evaluate performance of the failure prediction models generated by the model training module 506. In some embodiments, the model evaluation module 508 may perform x fold cross validation (CV) on training data sets to establish CV performance, including uncertainty of prediction. The model evaluation module 508 may test the developed model on balanced testing data sets (e.g., about 50:50 (failed and non-failed systems) or to be tuned for the desired business outcome).

In various embodiments, the model evaluation module 508 compares the predictions of each failure prediction model of a set of failure prediction models using historical sensor data to compare the results against ground truth (e.g., known failures and known periods of time that the component did not fail). The model evaluation module 508 may separate the outcomes into qualitative categories including true positives (TP), false positives (FP), true negatives (TN), false negatives (FN), positives (TP+FN), and negatives (TN+FP).

The model evaluation module 508 may utilize a failure forecasting performance measures (e.g., standard metrics in any detection/classification model). The metrics may include any or all of the following:

Confusion Matrix (FP,FN,TP,TN)

Receiver Operating Characteristics

Area Under the Curve

Predicted Failure→Failed: True Positive

Predicted Failure→Not Failed: False Positive

Predicted Non-failure→Not Failed: True Negative

Predicted Non-failure→Failed: False negative

Examples of the metrics may include the following:

Sensitivity, Recall, Hit Rate, or True Positive Rate (TPR):

$$TPR=TP/P=TP/(TP+FN)$$

Specificity or True Negative Rate (TNR)

$$TNR=TN/N=TN/(TN+FP)$$

Precision or Positive Predictive Value (PPV)

$$PPV=TP/(TP+FP)$$

Negative Predictive Value (NPV)

$$NPV=TN/(TN+FN)$$

Miss Rate or False Negative Rate (FNR)

$$FNR=FN/P=FN/(FN+TP)=1-TPR$$

Fall-out or False Negative Rate (FNR)

$$FPR=FP/N=FP/(FP+TN)=1-TNR$$

False Discovery Rate (FDR)

$$FDR=FP/(FP+TP)=1-PPV$$

False Omission Rate (FOR)

$$FOR=FN/(FN+TN)=1-NPV$$

Accuracy (ACC)

$$ACC=(TP+TN)/(P+N)=(TP+TN)/(TP+TN+FP+FN)$$

The F1 score is the harmonic mean of precision and sensitivity:

$$F_1 = 2 \cdot \frac{PPV \cdot TPR}{PPV + TPR} = \frac{2TP}{2TP + FP + FN}$$

The Matthews correlation coefficient (MCC) is:

$$MCC = \frac{TP \times TN - FP \times FN}{\sqrt{(TP+FP)(TP+FN)(TN+TP)(TN+FN)}}$$

The informedness or Bookmaker Informedness (BM) is:

$BM$=TPR+TNR−1

The Markedness (MK) is $MK$=PPV+NPV−1

In one example, the precision or positive predictive value of a failure prediction model may indicate that out of four alerts, three alerts are true failure cases and one alert is a false failure case which leads to 75% precision. In other words, if someone sends a crew based on this alarm, three times will result in preventative maintenance of any turbine downtime.

In various embodiments, the model evaluation module 508 determines a receiver operator characteristic area under the curve (ROC AUC) to assist in model performance evaluation. The Operating Characteristic Area Under the Curve is a measure of classifier performance in machine learning. When using normalized units, the area under the curve is equal to the probability that a classifier will rank a randomly chosen positive instance higher than a randomly chosen negative one (assuming 'positive' ranks higher than 'negative').

Figure 8:
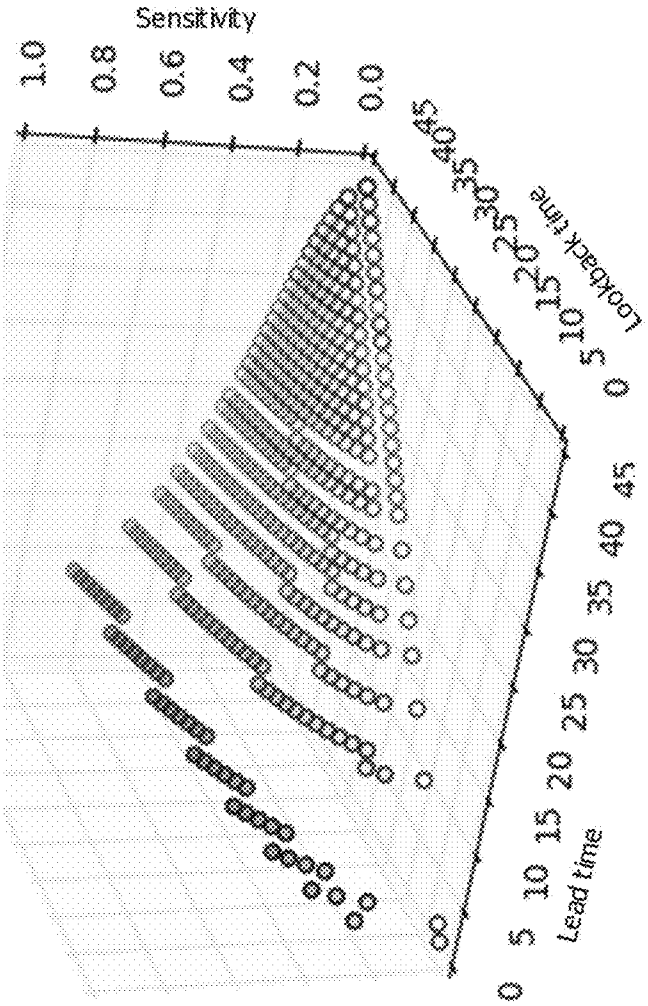
FIG. 8 depicts a curvature analysis that can be done for any or all of the performance metrics.

The model evaluation module 508 may test the different failure prediction models of different lead times and look-back times and compare the different evaluations to identify a preferred model. FIG. 8 depicts a curvature analysis that can be done for any or all of the performance metrics. In the curvature analysis, each ball in the three dimensional graph is a separate evaluation of the same model using different lead and lookback times and identifying the value of sensitivity for each evaluation.

In one example, the model evaluation module 508 evaluated different failure prediction models of different lookback and lead times:

| Lookback Time | Load Time | Train AUC | Train Sensitivity | Train Precision | Train Specificity |
|---|---|---|---|---|---|
| 31 | 1 | 71% | 54% | 63% | 69% |
| 33 | 3 | 92% | 83% | 83% | 83% |

With the increase of lead time from 1 to 3 days and consistent 30 days observation time window (lookback time—lead time), all the performance measure metrics are improved. As such, the model evaluation module 508 may select a failure prediction model with the lookback time of 33 days and lead time of 3 days as the configuration to apply for new data to predict future faults.

In various embodiments, the performance curvature may be assessed to assist in selection of a preferred failure prediction model. The performance look-up gives an expected forecasting outcome for a given lookback and lead time requirement. The performance look-up gives a reasonable lookback and lead time that an operator can expect (e.g. if an operator wants the sensitivity of the model being greater than 50%, the curvature will give the necessary lookback and appropriate lead time). As a result, the performance look-up gives a clear and comprehensive failure prediction model to model performance evaluation for all the possible choices (e.g., thereby enabling a selection of a failure prediction model for each set of failure prediction models).

In various embodiments, the model evaluation module 508 may generate the performance curvature, including the lookback and lead times to enable a user or authorized device to select a point along the performance curvature to identify and select a model with an expected forecasting outcome.

The model evaluation module 508 be configured to provide the performance curvature, any number of failure prediction models of a set of failure prediction models for a component or set of components, evaluations of the failure prediction models of a set, comparison of the evaluations, and the like to an entity authorized to make a selection of a failure prediction model. There may be any number of selected models, each of the selected models being for a different component, component type, groups of component, groups of component type, asset, and/or asset type.

In various embodiments, the model application module 510 may compare new sensor data to classified and/or categorized states identified by the selected model to identify when sensor data indicates a failure state or a state associated with potential failure is reached. In some embodiments, the model application module 510 may score the likelihood or confidence of such estate being reached. The model application module 510 may compare the confidence or score against a threshold in order to trigger an alert or report. In another example, the model application module 510 may compare the fit of sensor data to a failure state or state associate with potential failure that has been identified by the model of the model application module 510 in order to trigger or not trigger an alert or report.

The trigger module 516 may establish thresholds for different components, component types, groups of components, groups of component types, assets, and/or asset types. Each threshold may be compared to an output of one or more selected models. Thresholds may be established based on the performance of the selected model in order to provide an alarm based on likelihood (e.g., confidence) of prediction, seriousness of fault, seriousness of potential effect of the fault (e.g., infrastructure or life threatened), lead time of fault, and/or the like.

It will be appreciated that there may be different categorized states identified during model training. Each categorized state may be associated with a different type of failure including mode of failure, component of failure, and/or the like.

The report and alert generation module 518 may generate an alert based on the evaluation of the evaluation module 614. An alert may be a message indicating a failure or type of failure as well as the specific renewable energy asset (e.g., wind turbine or solar panel) that may be at risk of failure. Since the state identified by the failure prediction model is a state that is in advance of a potential failure, the alert should be triggered in advance of the potential failure such that corrective action may take place. In some embodiments, different alerts may be generated based on different possible failure and or different failure states. For example, some failure states may be more serious than others, as such more alerts and/or additional detailed alerts may be provided to a larger number of digital devices (e.g., cell phones, operators, utility companies, service computers, or the like) depending on the seriousness, significance, and/or imminence of failure.

In some embodiments, the report and alert generation module 518 may generate a report indicating any number of potential failures, the probability of such failure, and the justification or reasoning based on the model and the fit of previously identified states associated with future failure of components.

The data storage 520 may be any type of data storage including tables databases or the like. The data storage 520 may store models, historical data, current sensor data, states indicating possible future failure, alerts, reports, and/or the like.

A module may be hardware (e.g., circuitry and/or programmable chip), software, or a combination of hardware and software.

Figure 9:
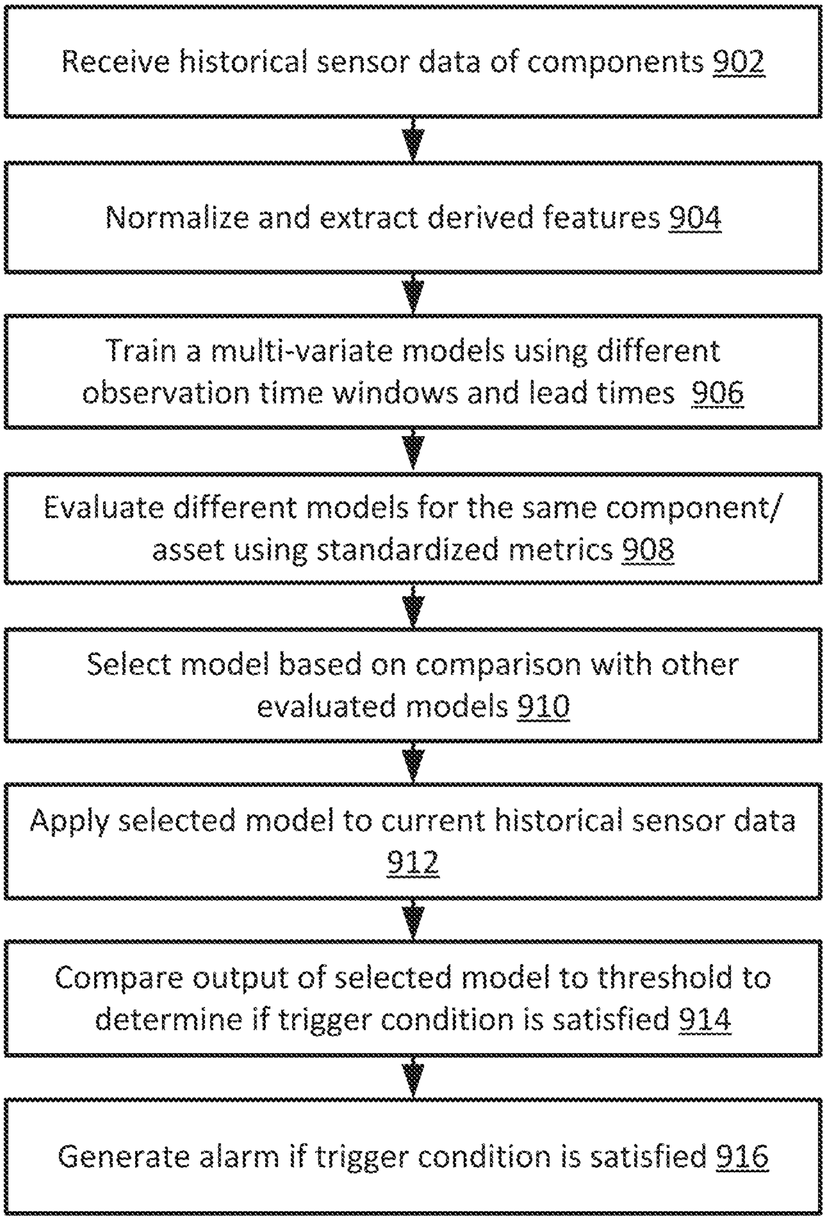
FIG. 9 is a flowchart for predicting failures and/or potential failures of renewable energy assets.

FIG. 9 is a flowchart for predicting failures and/or potential failures of renewable energy assets. In the example of FIG. 9, prediction failures and/or potential failures of wind turbines is discussed. In step 902, the communication module 502 receives the historical sensor data of any number of components of any number of electrical assets. In various embodiments, the component failure prediction system may generate any number of different failure prediction models for a set of failure prediction models, each set of failure prediction models being for each component, component group, type of component, type of component group, and/or the like. Each set of failure prediction models of the set of failure prediction models may vary in terms of the observation window (e.g., limited to a predetermined window of the historical data used to train a model) and/or lead time.

In step 904, the training data preparation module 504 may normalize and/or extract features (e.g., derived or not derived) from the received historical sensor data. It will be appreciate that, in some embodiments, the training data preparation module 504 may determine the observation window for a model to be trained, extract or receive the historical sensor data that was generated during the observation window, and reduce dimensionality of the data (e.g., using principal component analysis) and/or extract features (e.g., columns or metrics) from the historical sensor data to train one or more failure prediction models of the set.

In step 906, the model training module 506 trains any number of failure prediction models of a set using different observation windows of the historical sensor data and/or lead times for each different model of the same component, component group, type of component, type of component group, and/or the like. The model training module 506 may utilize k-means clustering, neural networks, random forests, or the like.

In step 908, the model evaluation module 508 may evaluate every failure prediction model of a set of failure prediction models. For example, the model evaluation module 508 may evaluate every model that predicts failure of a generator of a wind turbine. Each model of the set may vary depending on the observation window and the lead time window used in generating the model.

The model evaluation module 508 may utilize standardized metrics as discussed herein to evaluate the models of the set of models. The model evaluation module 508 may utilize any or all of the following metrics including, but not limited to, Sensitivity, Recall, Hit Rate, or True Positive Rate (TPR), Specificity or True Negative Rate (TNR), Precision or Positive Predictive Value (PPV), Negative Predictive Value (NPV), Miss Rate or False Negative Rate (FNR), Fall-out or False Negative Rate (FNR), False Discovery Rate (FDR), False Omission Rate (FOR), Accuracy (ACC), the F1 score is the harmonic mean of precision and sensitivity, the Matthews correlation coefficient (MCC), the informedness or Bookmaker Informedness (BM), the Markedness (MK), and/or area under the curve (AUC).

In step 910, the model evaluation module 508 may compare any number of the model evaluations of failure prediction models of a set of failure prediction models to any of the other set of model evaluations to select a preferred model of the set of models. For example, two different failure prediction models of a set with different lookback time (e.g., 31 and 33 days, respectively) and different lead times (e.g., 1 and 3 days, respectively) may have different AUC (71% and 92%, respectively), different train sensitivity (54% and 83%, respectively), different train precision (63% and 83%, respectively), and train specificity (69% and 83%, respectively). It will be appreciated that each failure prediction model of a set may be compared using similar metrics and/or different metrics as described above. Based on the two different failure prediction models in this example, the model evaluation module 508 or authorized entity may select the failure prediction model with the longer lead time, higher AUC, train sensitivity, train precision, and train specificity even though the lookback time is larger.

In step 912, the model application module 510 may receive current sensor data from the same components or group of components that provided the historical sensor data. The model application module 510 may apply the selected failure prediction model to the current sensor data to generate a prediction.

In step 914, the trigger module 512 may compare the output of the selected failure prediction model to a threshold to determine if trigger conditions are satisfied 914. In other words, the trigger module 512 may compare a probability of accuracy or confidence of a predicted failure to a failure prediction threshold. In various embodiments, the trigger module 512 may store threshold triggers in a threshold trigger database. There may be different trigger thresholds for different components, component types, groups of components, groups of component types, assets, and/or asset types. In various embodiments, there may be different trigger thresholds depending on the amount of damage that may be caused to the asset by failure, other assets by failure, the electrical grid, infrastructure, property and/or life. There may be different trigger thresholds based on the selected model (e.g., based on sensitivity, accuracy, amount of lead time, predicted time of failure, and/or the like). The different trigger thresholds may be set, in some embodiments, by a power company, authorized individual, authorized digital device, and/or the like.

In step 916, the report and alert generation module 514 may generate an alert if a trigger condition is satisfied. In some embodiments, the report and alert generation module 514 may have an alert threshold that must be triggered before the alert is issued. For example, the alert threshold may be based on the amount of damage that may be caused to the asset by failure, other assets by failure, the electrical grid, infrastructure, property and/or life. The alert may be issued by text, SMS, email, instant message, phone call, and/or the like. The alert may indicate the component, component group, type of component, type of component group, and/or the like that triggered the prediction as well as any information relevant to the prediction, like percentage of confidence and predicted time frame.

In various embodiments, a report is generated that may indicate any number of predicted failures of any number of components or groups of components based on application of selected models to different sensor data which may enable the system to provide a greater understanding of system health.

In some embodiments, the evaluation module 508 may evaluate cost based metrics of every model of a set of models for the same component, component group, type of component, type of component group, and/or the like. For example, the model evaluation module 508 may evaluate every model that predicts failure of a generator of a wind turbine and the effect on cost. Each model of the set may vary depending on the observation window and the lead time window used in generating the model.

The model evaluation module 508 may utilize standardized cost metrics to evaluate the failure prediction models of a set of failure prediction models. These can include:

Average Preventative Fix Cost (AFC)

Average Run-to-Failure Cost (ARFC)

Average Cost for Unnecessary Visit (ACUV)

A Baseline Cost Model (BCM) may include:

Cost of All-Run-to-Failure (CARF)=Number of Cases for Run-to-Failure*ARFC

As-is operation Cost of (AC)=Number of Cases for Failure*ARFC+Number of Cases for Preventative Fix*AFC+Number Cases of Unnecessary Visit*ACUV A Target Cost Model may include:

Predictive Maintenance Cost (PMC)=Number of Cases for Failure*ARFC+Number of Cases for Preventative Fix*AFC+Number of Cases of Unnecessary Visit*ACUV The model evaluation module 508 may compare the standardized cost metrics of any number of failure prediction models of a set of failure prediction models to each other to select or assist in selection of a model failure prediction of the set. In various embodiments, the model evaluation module 508 utilizes both the standardized performance metrics discussed herein as well as the standardized cost metrics in comparing different models and selecting a model from any number of the comparisons.

Figure 10:
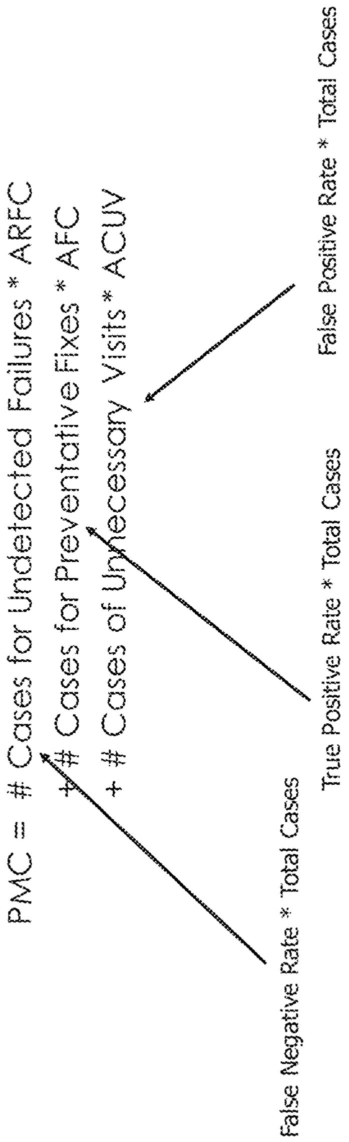
FIG. 10 depicts a calculation of an example predictive maintenance cost in one example.

FIG. 10 depicts a calculation of an example predictive maintenance cost in one example. In FIG. 10, the Number of Cases for Failure may be a false negative rate times the total number of cases. The number of cases of preventative fixes may be a true positive rate times the total number of cases. The number of cases of unnecessary visits may be a false positive rate times the total number of cases.

Figure 11:
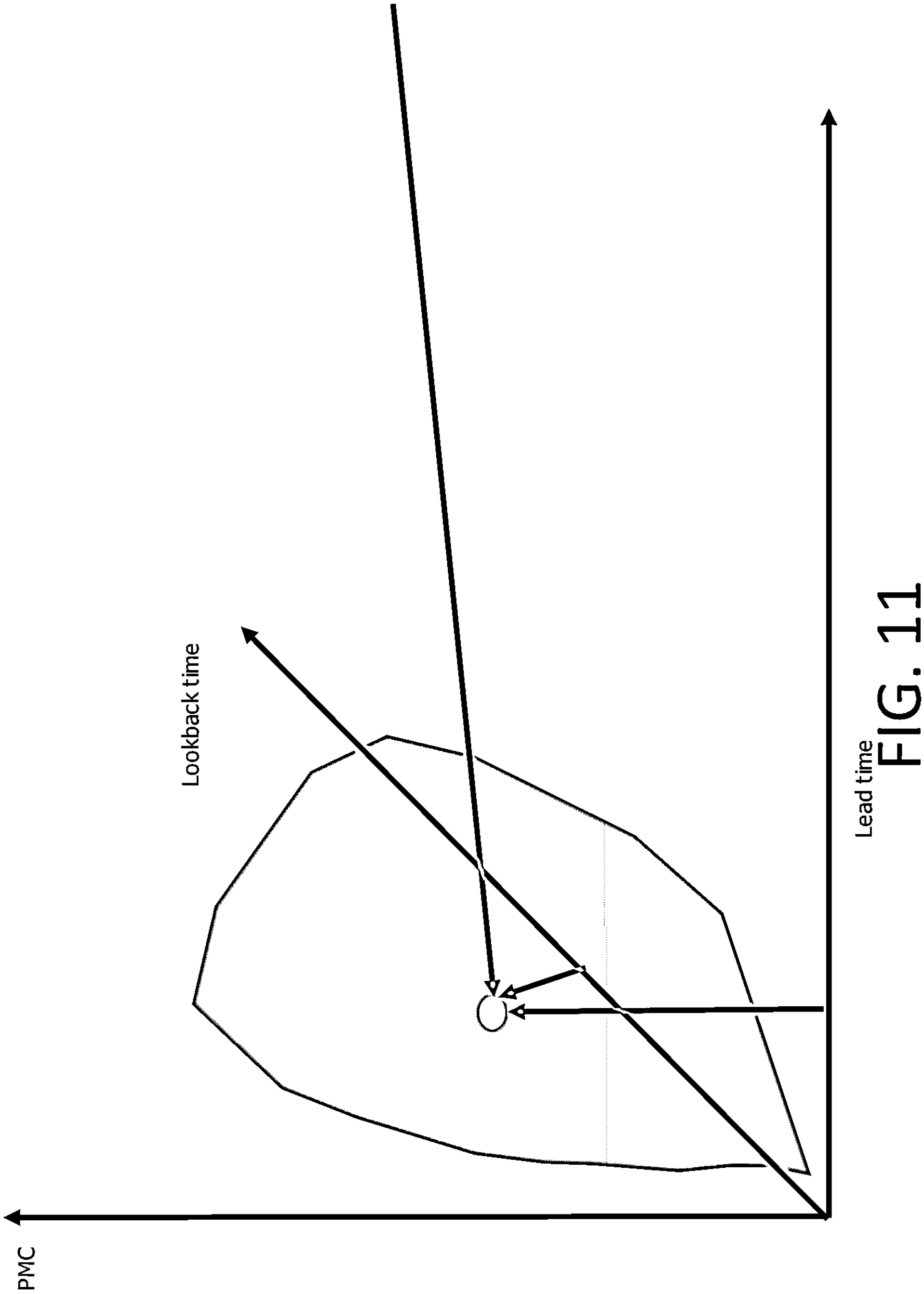
FIG. 11 is a graph of a further optimization of performance per cost analysis in some embodiments.

FIG. 11 is a graph of a further optimization of performance per cost analysis in some embodiments. In some embodiments, a model trainer may wish to publish a model to predict a particular failure of a component. The trainer can use target cost savings from the model training. In this case. A point on the figure (e.g., the dot) with arrows leading from lookback time and lead time is the point of target cost savings. From this characterization, the trainer may publish a model with a certain lead and lookback time.

FIG. 11 depicts a Predictive Maintenance Cost (PMC) along a vertical axis, a lead time along a horizontal axis, and a lookback time along the z axis. Through this different axis and comparison of different models using this graph, a preferred cost optimization may be utilized to select one or more models.

In various embodiments, the trigger module 512 may compare models applied to current data to thresholds based on cost as well as performance. As such, alerts may be generated based on a cost analysis (e.g., the impact of a failure on greater cost, even if the likelihood is moderate, may still be cause to generate an alert for preventative maintenance).

Supervisory control and Data Acquisition (SCADA) is a control system architecture often used to monitor and control aspects of hardware and software systems and networks. SCADA is one of the most commonly-used types of industrial control systems. SCADA may be used to provide remote access to a variety of local control modules which could be from different manufacturers which allows access through standard automation protocols. SCADA systems may be used to control large-scale processes at multiple sites and over large or small distances.

SCADA systems may be utilized for remote supervision and control of wind turbines and wind farms. For example, the SCADA system may enable control of any number of wind turbines in the wind farm (e.g., clusters of wind turbines, all wind turbines, or one wind turbine). The SCADA system may provide an overview of relevant parameters of each wind turbine including, for example, temperature, pitch angle, electrical parameters, rotor speed, yaw system, rotor velocity, azimuth angle, nacelle angle, and the like. The SCADA system may also allow remote access to the SCADA system to supervise and monitor any number of wind turbines of any number of wind farms.

The SCADA system may further log data regarding any number of the wind turbine such as failures, health information, performance, and the like. The SCADA system may allow access to the log data to one or more digital devices.

While examples of wind farms and wind turbines are discussed herein, it will be appreciated that SCADA systems may be utilized on any type of electrical asset or combination of different types of electrical assets including, for example, solar power generators, legacy electrical equipment, and the like.

SCADA system provide important signals for historical and present status of any number of wind turbines (WTs). However, an unmanageable number of alarms and event logs generated by a SCADA system is often ignored in wind turbine forecasting. Some embodiments of systems and method discussed herein leverages machine learning method (s) to extract a number of actionable insights from this valuable information.

Unfortunately, different manufactures have completely different SCADA systems alarms and event logs. Even the same manufacture can have different generation of wind turbines with significant amount variation of event codes and logs. This is a barrier for effective and scalable ways to utilize event codes and logs for wind turbine (WT) failure forecasting.

Figure 12:
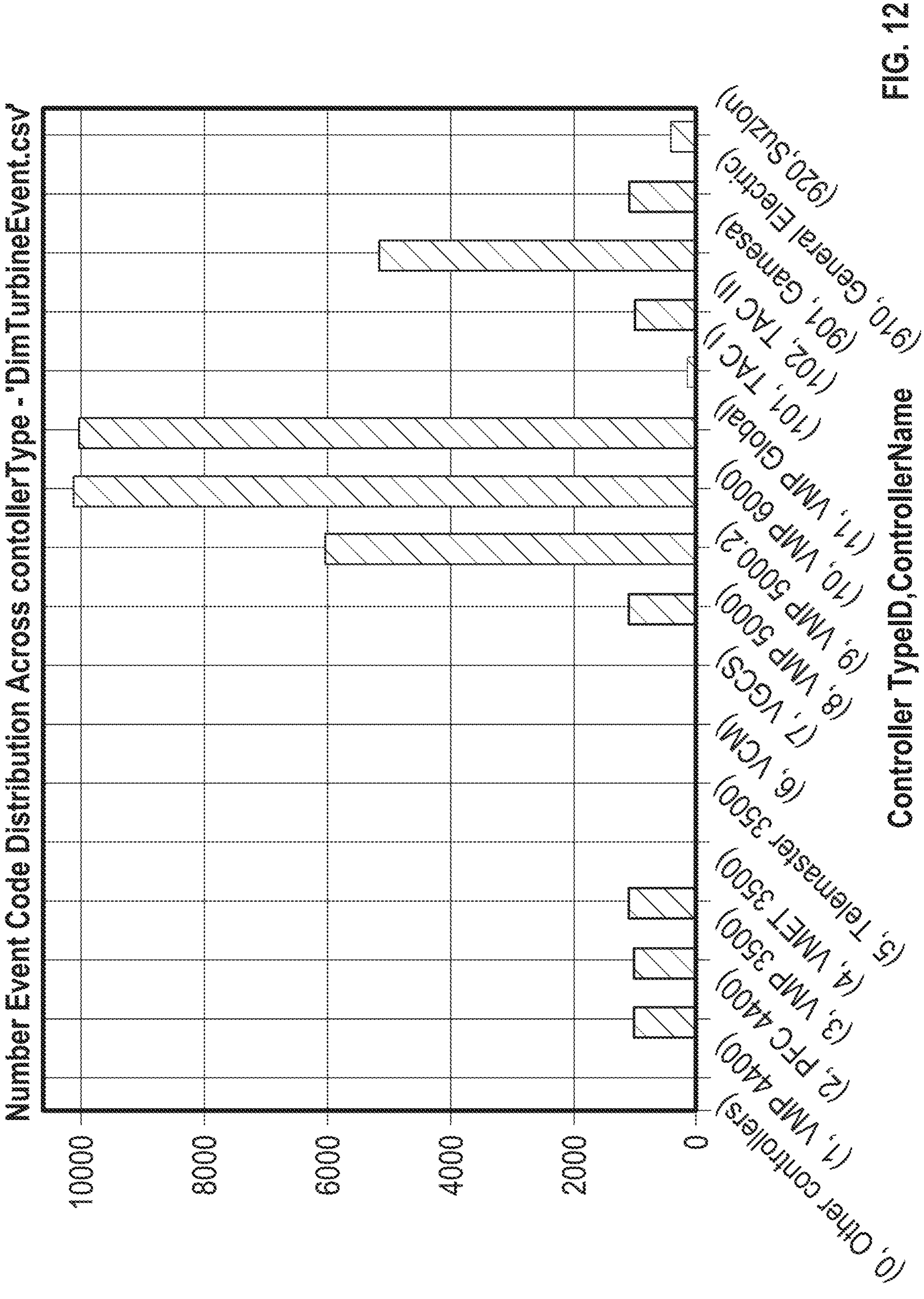
FIG. 12 is an example event code distribution for a broad number of controllers.

FIG. 12 is an example event code distribution for a broad number of controllers. The horizontal axes of FIG. 12 identifies a series of controllers by controller type identifier (ID) and controller name. The vertical axis indicates the number of thousands of different event codes for each controller. FIG. 12 demonstrates a complexity and inconsistency in event code designs across controllers. In other words, it is not feasible to define a set of rules to extract actionable insights due to the high variability of the event naming/coding convention (See 100 event codes vs. 10k event codes per a controller, etc. in FIG. 12).

In various embodiments, some systems and methods described herein utilize SCADA data to improve wind turbine failure forecasting. Systems described herein may effectively manage forecasting tasks across wind turbine manufacturers and generators and may further optimize wind turbine maintenance.

Figure 13:
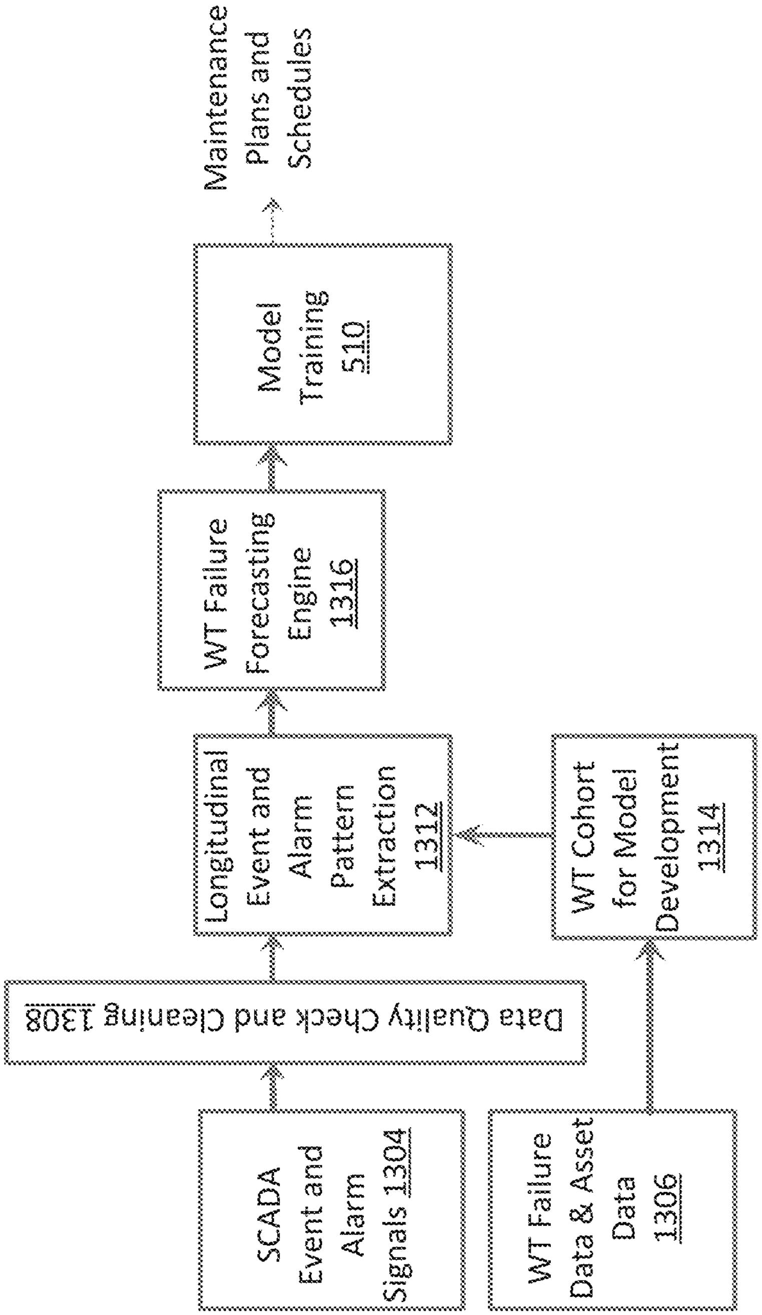
FIG. 13 shows an example overview of a wind turbine failure forecasting system pipeline using SCADA alarms and event logs in some embodiments.

FIG. 13 shows an example overview of a wind turbine failure forecasting system pipeline using SCADA alarms and event logs in some embodiments. FIG. 13 includes a SCADA event alarm signals module 1304, a WT failure data and asset data module 1306, a data quality check and cleaning module 1308, longitudinal event and alarm pattern extraction module 1312, WT cohort for model development module 1314, WT failure forecasting engine 1316, and the model training module 506 (see FIG. 5).

Figure 14:
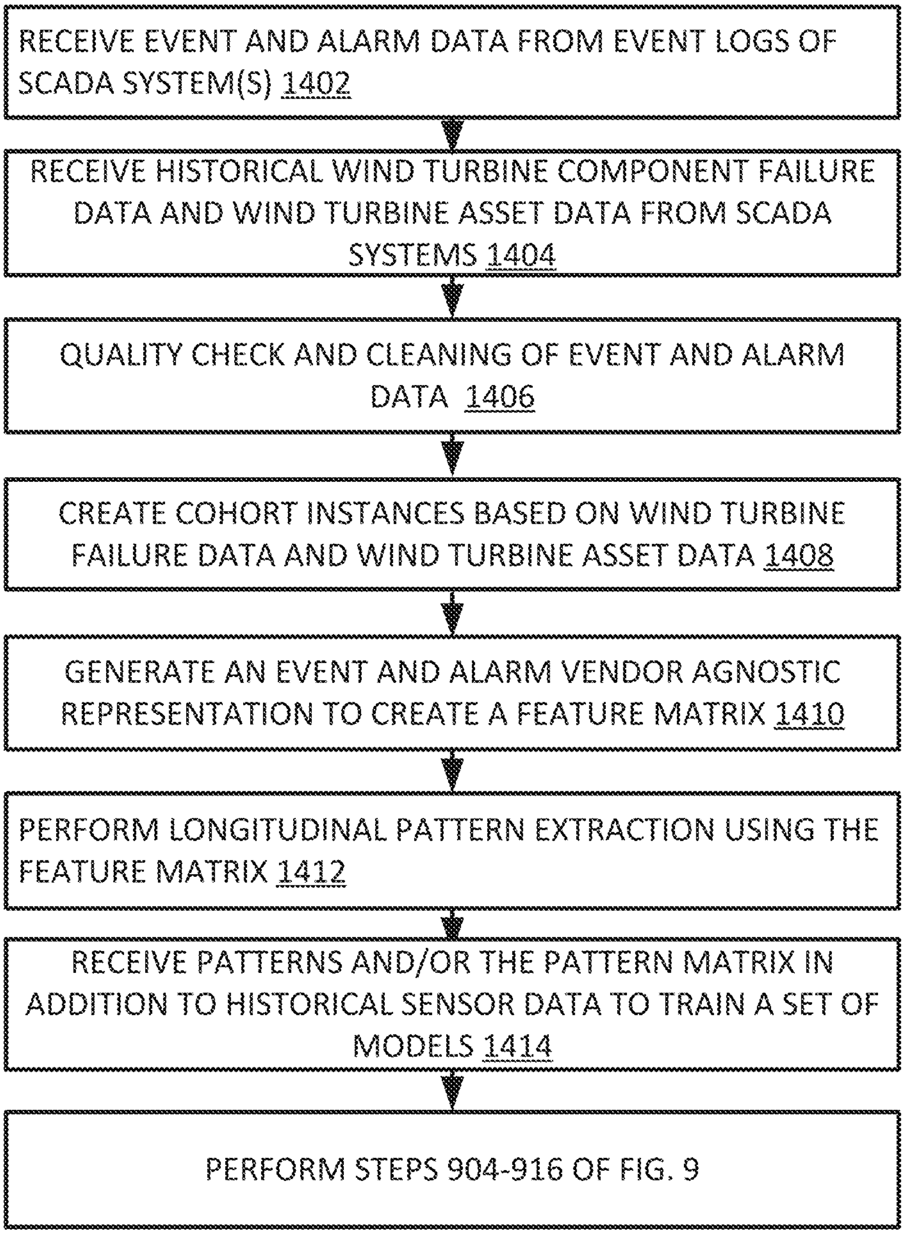
FIG. 14 is a flowchart for wind turbine failure forecasting using SCADA alarms and event logs in some embodiments.

FIG. 14 is a flowchart for wind turbine failure forecasting using SCADA alarms and event logs in some embodiments. While the flowchart in FIG. 14 addresses the use of SCADA alarm and event logs in conjunction with training multiple failure prediction models of a set of models, it will be appreciate that systems and methods described herein may utilize SCADA alarm and event logs in conjunction with training one or more failure prediction models (e.g., without training and evaluating failure prediction models of a set of failure prediction models to select a preferred model).

In step 1402, the SCADA event alarm signals module 1304 may receive event and alarm data from one or more SCADA systems used to supervise and monitor any number of wind turbines. The SCADA event alarm signals module 1304 may include an input interface to receive detailed event and alarm logs as well as event and alarm metadata. The event and alarm logs may include, but are not limited to, a turbine identifier (e.g., turbineID), event code (e.g., EventCode), event type (e.g., EventType), event start time (e.g., EventStartTime), event end time (e.g., EventEndTime), component, subcomponent, and/or the like. The turbine identifier may be an identifier that identifies a particular wind turbine or group of turbines. An event code may be a code that indicates an event associated with performance or health of the particular wind turbine or group of turbines. The event type may be a classification of performance or health. An event start time may be a particular time that an event (e.g., an occurrence that affects performance or health) began and an event end time may be a particular time that the event ended. Components and subcomponents may include identifiers that identify one or more components or subcomponents that may be affected by the event.

The alarm metadata may include, but is not limited to, an event code (e.g., EventCode), description, and the like.

FIG. 15*a* depicts an example event log. The event log includes a turbine identifier, an event code number, a turbine event type, an event start time (e.g., EventStartUTC) which identifies a time of a beginning of an event using universal time, an event end time (e.g., EventEndUTC) which identifies a time of an ending of an event using universal time), description, turbine event identifier, parameter 1, and parameter two.

In this example, the same wind turbine is undergoing four different events, including a change in wind speed, a change in pitch, a remote power setpoint change, and a generator outage.

FIG. 15*b* depicts example alarm metadata. The event metadata example of FIG. 14*b* includes an event description and an event code. In various embodiments, the event metadata is not necessary for model development. In some embodiments, all or some of the event metadata may assist for model interpretation.

In step 1404, the WT failure data and asset data module 1306 may receive historical wind turbine component failure data and wind turbine asset metadata from one or more SCADA systems used to supervise and monitor any number of wind turbines. The WT failure data and asset data module 1306 may include an input interface to receive the historical wind turbine component failure data and the wind turbine asset data. The historical wind turbine component failure data may include but not be limited to a turbine identifier (e.g., TurbineId), failure start time (e.g., FailureStartTime), failure end time (e.g., FailureEndTime), component, subcomponent, part, comments, and/or the like. The turbine identifier may identify a wind turbine or group of wind turbines. A failure start time may be a time where a failure of a component, subcomponent, or part of the wind turbine begins. A failure end time may be a time where a failure of a component, subcomponent, or part of the wind turbine ends.

The wind turbine asset data may include, but is not limited to, wind turbine generation, mark version, geolocation, and/or the like. Wind turbine generation may indicate an amount of power being generated. A mark version may be a version of a component, subcomponent, part, or wind turbine. The geolocation may indicate the geographic location of a wind turbine or group of wind turbines.

In step 1406, the data quality check and cleaning module 1308 may conduct basic event data quality checks such as, but not limited to: daily availability check (e.g., minimum number of daily event code counts), event code option check (e.g., non-recognizable event), timestamp availability check, and/or the like. The data quality check and cleaning module 1308 may also conduct cleaning based on defined business rules (e.g. discard event data without start timestamp, and/or the like).

In step 1408, the WT cohort for model development module 1314 may receive the wind turbine failure data and asset data. The WT cohort for model development module 1314 may generate or extract cohorts for model development. A cohort may be a set of wind turbines having the same controller type and operating in a similar geography. In one example, example, the WT cohort for model development module 1314 identifies similar or same controller types based on the asset data and the geolocation to generate any number of cohorts.

The WT cohort for model development module 1314 may also identify both healthy time window WT instances and component failure time window WT instances from the failure data for any number of components, subcomponents, parts, wind turbines, and/or cohorts (e.g. instance number 2: 303615 had generator failure during 20180101-20180115).

In step 1410, the longitudinal event and alarm pattern extraction module 1312 may generate an event and alarm vendor agnostic representation. In various embodiments, the longitudinal event and alarm pattern extraction module 1312 receives the event and alarm logs as well as event and alarm metadata. In one example, the data quality check and cleaning module 1308 may check whether the event and alarm logs as well as event and alarm metadata conform to standardized input interfaces.

The longitudinal event and alarm pattern extraction module 1312 may modify the event and alarm log data from the event and alarm log and/or the alarm metadata to represent the event and alarm data in a vendor agnostic and machine readable way (e.g., by structuring the event and alarm log data).

FIG. 16 depicts an example feature matrix generated by the longitudinal event and alarm pattern extraction module 1312 in some embodiments. The example feature matrix includes an event description, event code, and unique feature identifier. In some embodiments, a benefit of the method of generating a feature matrix is that information from the event and alarm log is structured and organized in a manner that is wind turbine manufacturer and generator independent.

For example, the longitudinal event and alarm pattern extraction module 1312 may receive event and alarm log data. In some embodiments, longitudinal event and alarm pattern extraction module 1312 further receives alarm metadata. The longitudinal event and alarm pattern extraction module 1312 assigns each event code a unique feature identifier (FID). The identifier may be used as a column index in a feature matrix.

In various embodiments, the longitudinal event and alarm pattern extraction module 1312 extracts information from the event and alarm log and the alarm metadata, assigns a unique feature identifier, and generates the feature matrix.

In various embodiments, the longitudinal event and alarm pattern extraction module 1312 parses information from the event and alarm log data and/or alarm metadata to generate one or more feature matrixes. In some embodiments, the longitudinal event and alarm pattern extraction module 1312 may utilize different templates associated with different SCADA outputs to parse the information from the longitudinal event and alarm pattern extraction module 1312 and generate the feature matrix(es) to structure the data.

In step 1412, the longitudinal event and alarm pattern extraction module 1312 may mine and discover patterns among the event and alarm data in the longitudinal history (e.g., patterns may be as simple as unique event code counts in a past time period such as a month, advanced time sequence patterns such as A→B→C, or complicated encoded event sequence vectors). In various embodiments, the longitudinal event and alarm pattern extraction module 1312 may utilize the feature matrix(es) to discover patterns. The longitudinal event and alarm pattern extraction module 1312 may provide the discovered patterns to the WT failure forecasting engine 1316.

The longitudinal event and alarm pattern extraction module 1312 may perform longitudinal pattern extraction by counting a number of each event code that happened during a certain time interval (e.g., based on the observation time window).

FIG. 17 depicts an example longitudinal pattern extraction matrix that identifies for each instance identifier a number that each unique feature identifier occurs in a period of time. For example, unique feature identifier 0 occurs 3000 for instance identifier 28, and unique feature identifier 190 occurs 29,450 for instance identifier 28 during the same period of time.

Figure 18:
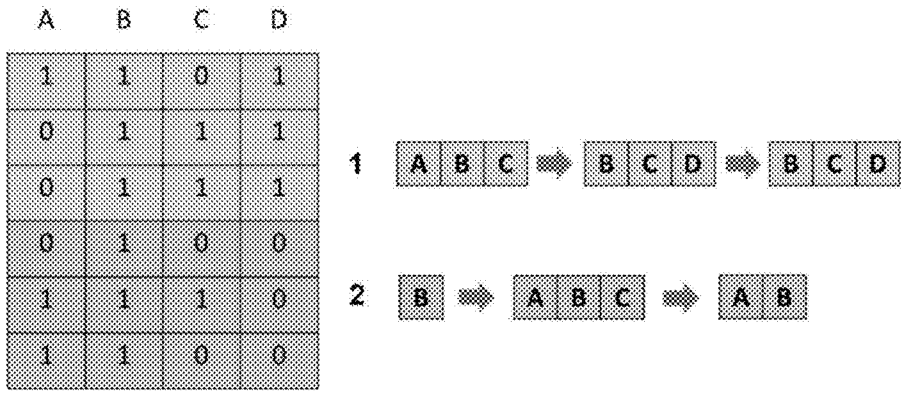
FIG. 18 depicts example patterns that represent longitudinal patterns by distinct event sequences.

The longitudinal event and alarm pattern extraction module 1312 may then count a number of each event code that occurred during the period of time and sequence events. FIG. 18 depicts example patterns that represent longitudinal patterns by distinct event sequences.

In various embodiments, the longitudinal event and alarm pattern extraction module 1312 provides the capability to consider dynamics of event codes in a longitudinal time dimension which may include important features for wind turbine failure forecasting and may be impractical to extract from operational signals.

In some embodiments, the longitudinal event and alarm pattern extraction module 1312 extracts information from the event and alarm log for a first time period, the alarm metadata for the same first time period, weather turbine failure data for the same first time period, and cohorts determined by the WT cohort for model development module 1314 in generating the feature matrix.

In various embodiments, the WT failure forecasting engine 1316 may receive extracted features, event data, and labels (e.g., failure or no failure) for each instance and may provide the information to the model training module 506.

In step 1414, the model training module 506 of FIG. 5 may receive patterns and/or the pattern matrix in addition to historical sensor data to train a set of failure prediction models. As discussed herein, each set of failure prediction models may be for a component, set of components, or the like.

In various embodiments, the model training module 506 may also receive features extracted from operational signals of one or more SCADA systems. In some embodiments, a SCADA operational signal module (not depicted) may receive any number of operational signals regarding one or more SCADA systems. A longitudinal SCADA feature extraction module (not depicted) may optionally extract operational features from the operational signals and provide them to the model training module 506 to be utilized in addition to the patterns and/or the pattern matrix in addition to historical sensor data to train the set of models.

By leveraging SCADA logs and metadata using agnostic representations to derive patterns useful in machine learning, the failure prediction models may improve for accuracy and scalability. It will be appreciated that the event logs, alarm information, and the like generated by SCADA may reduce processing time for model generation thereby enabling multiple failure prediction models to be generated in a timely matter (e.g., before the historical sensor data becomes scale) enabling scaling of the system yet with improved accuracy. It will be appreciated that generating a different failure prediction model for different components or groups of components of a set of wind turbines is computationally resource heavy and thereby may slow the process of model generation. This problem is compounded when creating a set of failure prediction models for each of the different components or groups of components of a set of wind turbines and evaluating different observation windows and lead times to identify preferred failure prediction models with better accuracy at desired lead times.

It will be appreciated that systems and methods described herein overcome the current challenge of using SCADA logs and metadata from different sources and utilizing the information to improve scalability and improve accuracy of an otherwise resource-intensive process, thereby overcoming a technological hurdle that was created by computer technology.

Steps 904 through 916 from FIG. 9 may utilize the patterns and/or pattern matrix in addition to the historical sensor data (as well as operational features of SCADA system(s)) to train a set of models.

As discussed herein, the model training module 506 may generate any number of failure prediction models using the historical sensor data, the patterns from the longitudinal event and alarm pattern extraction module 1312, and different configurations for lead and observation time windows. For example, the model training module 506 may generate different failure prediction models for a component or set of components using different amounts of historical sensor data (e.g., historical sensor data generated over different time periods), using different patterns (based on event and alarm logs and/or metadata generated during different time periods), and with different lead lookahead times.

The model evaluation module 508 may evaluate any or all of the failure prediction models of a set generated by the model training module 506 to identify a preferred failure prediction model in comparison to the other preferred failure prediction models of the set and preferred criteria (e.g., longer lead times are preferred). The model evaluation module 508 may retrospectively evaluate failure prediction models on training, validation (including cross-validation) and testing data sets, and provide performance measure and confidence reports, including but not limited to AUC, accuracy, sensitivity, specificity and precision, and/or the like.

In various embodiments, the model evaluation module 508 may evaluate each failure prediction model of a set of failure prediction models for each component, component type, part, group of components, assets, and/or the like as discussed herein.

In various embodiments, model evaluation module 508 may assess a performance curvature to assist in selection of a preferred failure prediction model of a set. The performance look-up gives an expected forecasting outcome for a given lookback and lead time requirement. The performance look-up gives a reasonable lookback and lead time that an operator can expect.

In various embodiments, the component failure prediction system 104 may generate the performance curvature, including the lookback and lead times to enable a user or authorized device to select a point along the performance curvature to identify ad select a model with an expected forecasting outcome.

The model application module 510 may be configured to apply a preferred or selected failure prediction model (in comparison with other failure prediction models and selected by the model evaluation module 508 and/or an entity authorized to make the selection based on comparison of evaluation with any number of other generated models) to current (e.g., new) sensor data received from the same wind turbine or renewable asset equipment that was used to produce the sensor data of the previous received historical data.

There may be any number of selected failure prediction models, each of the selected failure prediction models being for a different component, component type, groups of component, groups of component type, asset, and/or asset type.

In various embodiments, the model application module 510 may compare new sensor data to classified and/or categorized states identified by the selected failure prediction model to identify when sensor data indicates a failure state or a state associated with potential failure is reached. In some embodiments, the model application module 510 may score the likelihood or confidence of such estate being reached. The model application module 510 may compare the confidence or score against a threshold in order to trigger an alert or report. In another example, the model application module 510 may compare the fit of sensor data to a failure state or state associate with potential failure that has been identified by the model of the model application module 510 in order to trigger or not trigger an alert or report.

The trigger module 516 may establish thresholds for different components, component types, groups of components, groups of component types, assets, and/or asset types. Each threshold may be compared to an output of one or more selected failure prediction models. Thresholds may be established based on the performance of the selected model in order to provide an alarm based on likelihood (e.g., confidence) of prediction, seriousness of fault, seriousness of potential effect of the fault (e.g., infrastructure or life threatened), lead time of fault, and/or the like.

It will be appreciated that there may be different categorized states identified during model training. Each categorized state may be associated with a different type of failure including mode of failure, component of failure, and/or the like.

The report and alert generation module 518 may generate an alert based on the evaluation of the evaluation module 614. An alert may be a message indicating a failure or type of failure as well as the specific renewable energy asset (e.g., wind turbine or solar panel) that may be at risk of failure. Since the state identified by the failure prediction model is a state that is in advance of a potential failure, the alert should be triggered in advance of the potential failure such that corrective action may take place. In some embodiments, different alerts may be generated based on different possible failure and or different failure states. For example, some failure states may be more serious than others, as such more alerts and/or additional detailed alerts may be provided to a larger number of digital devices (e.g., cell phones, operators, utility companies, service computers, or the like) depending on the seriousness, significance, and/or imminence of failure.

In some embodiments, the report and alert generation module 518 may generate a report indicating any number of potential failures, the probability of such failure, and the justification or reasoning based on the model and the fit of previously identified states associated with future failure of components. The report may be a maintenance plan or schedule to correct the predicted fault (e.g., preferably before failure and a minimum of power disruption).

The data storage 520 may be any type of data storage including tables databases or the like. The data storage 520 may store models, historical data, current sensor data, states indicating possible future failure, alerts, reports, and/or the like.

Figure 19:
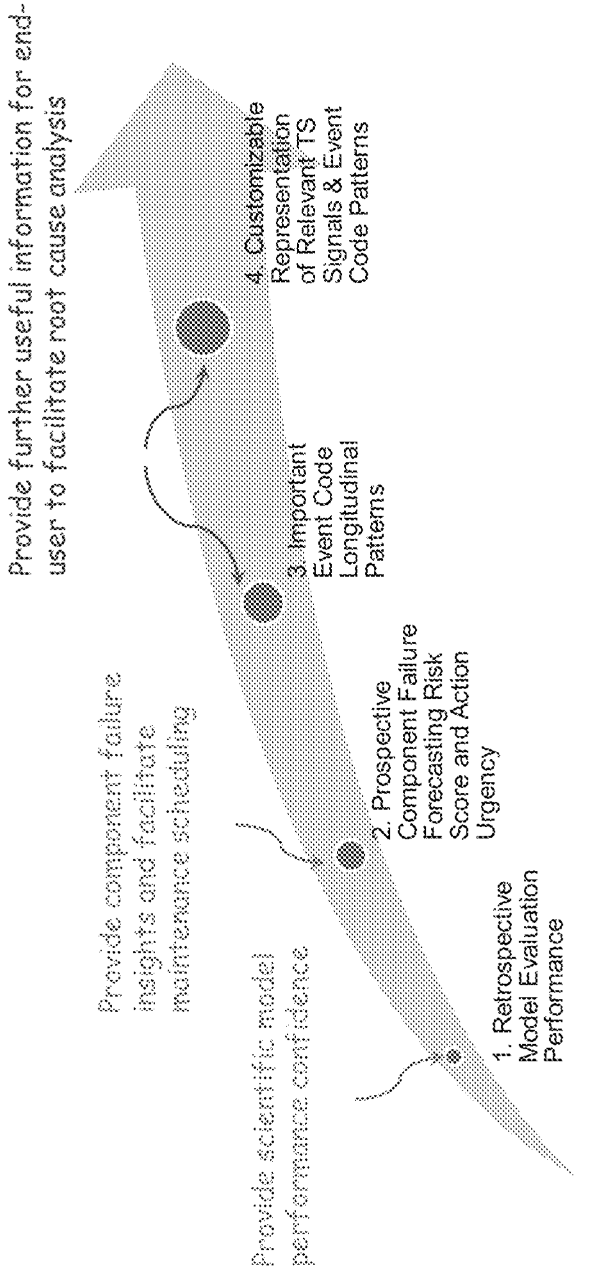
FIG. 19 is a summary framework to provide actionable insights with the failure prediction.

The report and alert generation module 518 may be modified to provide actional insights within a report or alert. FIG. 19 is a summary framework to provide actionable insights with the failure prediction. The report and alert generation module 518 may provide retrospective model evaluation performance (provide scientific model performance confidence), prospective component failure forecasting risk score and action urgency (provide component failure insights and facilitate maintenance scheduling), important event code longitudinal patterns that are drivers of risk scores, and customizable representation of relevant time-series signals and event code patterns (provide further useful information for end-user for root cause analysis).

FIG. 20 depicts an example retrospective model evaluation performance depiction in some embodiments. the example retrospective model evaluation performance depiction may include an event code count representation method whereby failure prediction model evaluations are summarized. In some embodiments, the report and alert generation module 518 may summarize or report any number of standardized metrics for a selected failure prediction model. Although metrics such as Area under the Curve, accuracy, precision, recall, and specificity are depicted in FIG. 20, it will be appreciated that any number of metrics may be displayed. Training data may include balanced instances extracted from one or more wind turbines during a particular historical time period (e.g., the historical time period that coincides with the observation time window for the selected failure prediction model). Testing data may include balanced instances extracted from the same the same one or more wind turbines over a subsequent historical time period (e.g., subsequent to the training time period). For example, the testing data may include data that was not used to train the selected failure prediction model but may have been used to test the predictions using known truth. The Cross-validation data may assist in validating the model across different metrics.

FIG. 21 depicts a prospective component failure forecasting risk score and action urgency depiction in some embodiments. The prospective component failure forecasting risk score and action urgency depiction may include the predictions of failure for any number of components. For those components where predicted risk is above a trigger threshold, information may be highlighted or otherwise emphasized.

In FIG. 21, the prospective component failure forecasting risk score and action urgency depiction includes an asset identifier, component name, update time (e.g., time of the prediction), risk score of failure, forecast lead time, and indicator (e.g., a classification indicating a degree of danger of fault or performance health). In this example, the generator of asset identifier 303056 has an 83% risk of failure. The generator 303060 has a 60% risk of failure. Assuming that the risk of failure is greater than a trigger threshold for generators, the prospective component failure forecasting risk score and action urgency depiction may highlight or otherwise emphasize information regarding the two generators that are at risk. Further, the failure risk score may provide information for a scheduled plan and prioritization.

Figure 23:
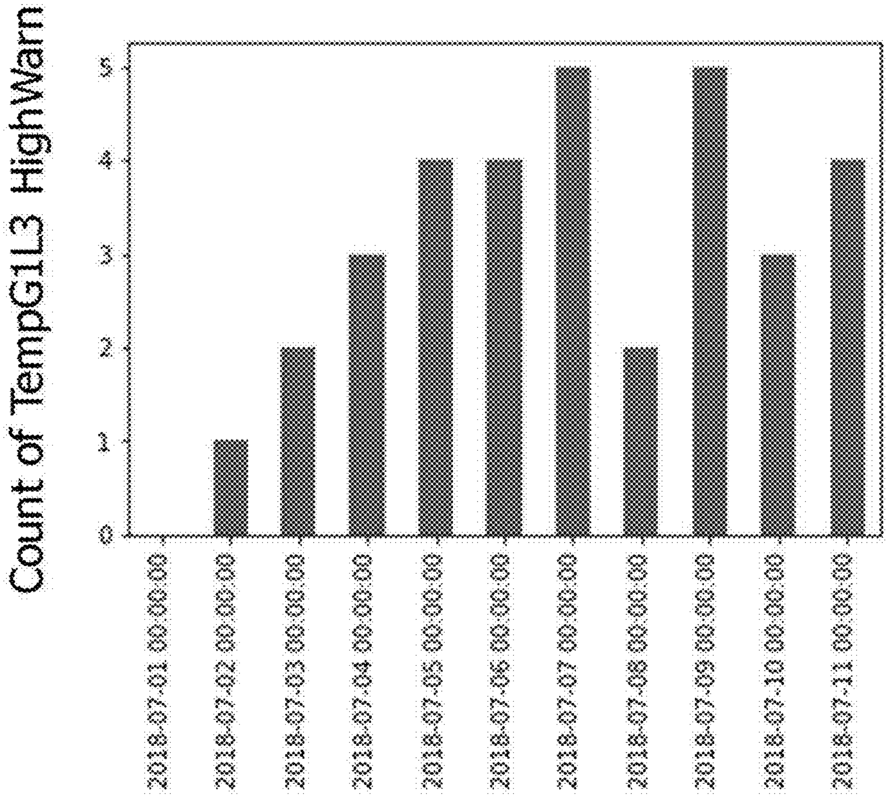
FIG. 23 includes customizable representations of relevant TS signals and event code patterns.

FIGS. 22 and 23 may be used for an end user to facility root cause analysis which may be useful for prescription analytics. FIG. 22 depicts selected event code longitudinal patterns in one example. The table in FIG. 22 includes feature descriptions, feature identifier, and importance score of that feature to the prediction score. In various embodiments, the model application module 510 may determine a impact score for any or all features. The impact score may indicate the degree of impact that the feature had on the failure prediction.

By reviewing the importance score for different features, a user may be able to assess the root cause of the failure to assist in taking the right action to correct the problem. As discussed herein, a fault may be caused by any number of factors, some of which may be more expensive, time consuming, and wasteful (e.g., in terms of delayed energy output) than others. The table in FIG. 22 may enable a user to make decisions to correct the root problem and improve uptime.

FIG. 23 includes customizable representations of relevant TS signals and event code patterns. FIG. 23 depicts a graph indicating a count of warnings and timestamps. In some embodiments, the report and alert generation module 518 provides different views including risk factors for forecasting. The report and alert generation module 518 may also allow a customizable view of event patterns to assist in making decisions to correct a root problem (e.g., predicted failure), and improve uptime and energy throughput.

It will be appreciated that various systems in the prior art may identify a possible fault but with only generalities. As such, technology has provided improvements to maintenance and reduction of failures in renewable energy assets, however, the same technology creates technical problems in addressing the failures in a manner that corrects the problem and reduces downtime. Systems and methods discussed herein not only predict failures using SCADA information and historical information to train multiple models with different observation windows and lead windows, but may enable predictions of components with an improved degree of accuracy such that the predicted failure may be addressed in a manner that reduces downtime that otherwise would have resulted in lost power, damage to infrastructure, poor client service, and possible power loss (which may impact infrastructure and lives).

Figure 24:
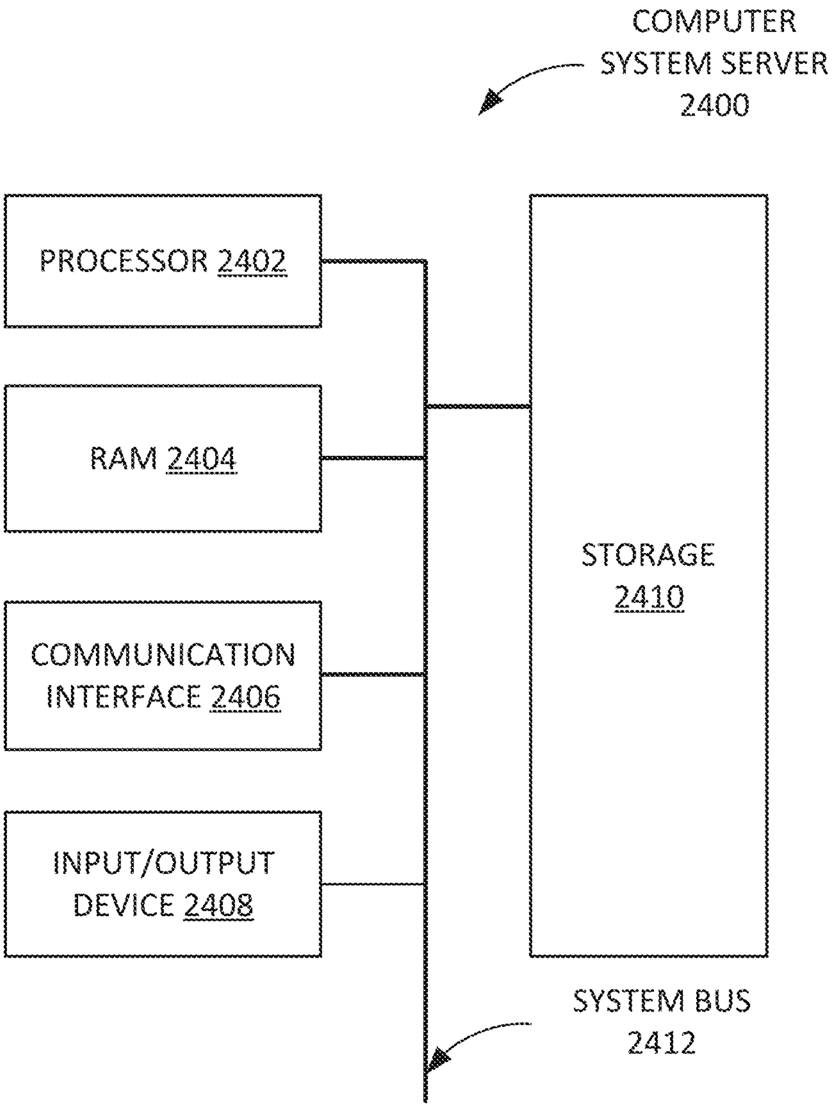
FIG. 24 depicts a block diagram of an example computer system server according to some embodiments.

FIG. 24 depicts a block diagram of an example computer system server 2400 according to some embodiments. Computer system server 2400 is shown in the form of a general-purpose computing device. Computer system server 2400 includes processor 2402, RAM 2404, communication interface 2406, input/output device 2408, storage 2410, and a system bus 2412 that couples various system components including storage 2410 to processor 2402.

System bus 2412 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system server 2400 typically includes a variety of computer system readable media. Such media may be any available media that is accessible by congestion mitigation system 2404 and it includes both volatile and nonvolatile media, removable and non-removable media.

In some embodiments, processor 2402 is configured to execute executable instructions (e.g., programs). In some embodiments, the processor 1004 comprises circuitry or any processor capable of processing the executable instructions.

In some embodiments, RAM 2404 stores data. In various embodiments, working data is stored within RAM 2406. The data within RAM 2406 may be cleared or ultimately transferred to storage 2410.

In some embodiments, communication interface 2406 is coupled to a network via communication interface 2406. Such communication can occur via Input/Output (I/O) device 2408. Still yet, congestion mitigation system 2404 can communicate with one or more networks such as a local area network (LAN), a general wide area network (WAN), and/or a public network (e.g., the Internet).

In some embodiments, input/output device 2408 is any device that inputs data (e.g., mouse, keyboard, stylus) or outputs data (e.g., speaker, display, virtual reality headset).

In some embodiments, storage 2410 can include computer system readable media in the form of volatile memory, such as read only memory (ROM) and/or cache memory. Storage 2410 may further include other removable/non-removable, volatile/non-volatile computer system storage media. By way of example only, storage 2410 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CDROM, DVD-ROM or other optical media can be provided. In such instances, each can be connected to system bus 2412 by one or more data media interfaces. As will be further depicted and described below, storage 2410 may include at least one program product having a set (e.g., at least one) of program modules that are configured to carry out the functions of embodiments of the invention. In some embodiments, RAM 2404 is found within storage 2410.

Program/utility, having a set (at least one) of program modules, such as congestion mitigation system 2404, may be stored in storage 2410 by way of example, and not limitation, as well as an operating system, one or more application programs, other program modules, and program data. Each of the operating system, one or more application programs, other program modules, and program data or some combination thereof, may include an implementation of a networking environment. Program modules generally carry out the functions and/or methodologies of embodiments of the invention as described herein.

It should be understood that although not shown, other hardware and/or software components could be used in conjunction with congestion mitigation system 2404. Examples, include, but are not limited to: microcode, device drivers, redundant processing units, and external disk drive arrays, RAID systems, tape drives, and data archival storage systems, etc.

Exemplary embodiments are described herein in detail with reference to the accompanying drawings. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

As will be appreciated by one skilled in the art, aspects of one or more embodiments may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The invention claimed is:

1. A non-transitory computer readable medium comprising executable instructions, the executable instructions being executable by one or more processors to perform a method, the method comprising:

receiving log data from event logs of one or more Supervisory Control and Data Acquisition (SCADA) systems that monitor renewable energy assets, the log data being generated during a first time period;

creating cohort instances based on historical failure data, the cohort instances representing a subset of the renewable energy assets, the subset of the renewable energy assets including a same type of controller and operating in a similar geography;

creating a feature matrix based on the cohort instances, wherein the feature matrix includes a unique feature identifier for any number of features of the historical failure data;

extracting patterns of events from the log data based on the feature matrix;

generating a first set of failure prediction models using first historical sensor data and the patterns of events, the first historical sensor data including sensor data from one or more sensors of one or more components of the renewable energy assets, the first historical sensor data indicating at least one first failure associated with the one or more components of the renewable energy asset during the first time period, each of the first set of failure prediction models being trained using different amounts of the first historical sensor data based on different observation time windows and different lead time windows, each observation time window including a time period during which the first historical sensor data is generated, the lead time window including a period of time before a predicted failure;

evaluating, for each of the first set of failure prediction models using at least a confusion matrix including metrics for true positives, false positives, true negatives, and false negatives as well as a positive prediction value;

comparing the confusion matrix and the positive prediction value of each of the first set of failure prediction models;

selecting at least one failure prediction model of the first set of failure prediction models based on the comparison of the confusion matrixes, the positive prediction values, and the lead time windows;

receiving first current sensor data of a second time period, the first current sensor data including sensor data from the one or more sensors of the one or more components of the renewable energy assets;

applying the selected failure prediction model to the first current sensor data to generate a first failure prediction of a failure of at least one component of the one or more components;

comparing the first failure prediction to a trigger criteria;

generating a first alert based on the comparison of the first failure prediction to the trigger criteria, the first alert indicating the at least one component of the one or more components and information regarding the first failure prediction including failure type and severity, wherein different alerts are generated based on different failure types and severity levels; and transmitting the first alert to one or more digital devices based on the severity, significance, and imminence of failure, thereby reducing occurrences of failure of at least a subset of the renewable energy assets being monitored by the one or more SCADA systems and prevent damage to infrastructure and power loss.

2. The non-transitory computer readable medium of claim 1, the method further comprises cleaning of the log data, the cleaning comprising discarding event data missing expected information.

3. The non-transitory computer readable medium of claim 1, wherein extracting patterns of events from the log data comprises counting a number of event codes of events that occurred during a time interval using the feature matrix and sequence the event codes to include dynamics of events in a longitudinal time dimension.

4. The non-transitory computer readable medium of claim 3, wherein the time interval is the first time period, the first historical sensor data being generated by the one or more sensors during the first time period.

5. The non-transitory computer readable medium of claim 1, wherein events of the patterns of events occur during the first time period.

6. The non-transitory computer readable medium of claim 1, wherein the renewable energy asset is a wind turbine.

7. The non-transitory computer readable medium of claim 1, wherein the log data includes wind turbine component failure data.

8. The non-transitory computer readable medium of claim 1, wherein the method further comprises retrieving the trigger criteria from a datastore including a plurality of trigger criteria, the trigger criteria being retrieved based at least in part on the at least one component of the one or more components.

9. The non-transitory computer readable medium of claim 1, wherein the method further comprises receiving operational signals from the one or more SCADA systems and extracting features from the operational signals, wherein generating the first set of failure prediction models uses the first historical sensor data, the patterns of events, and extracted features from the operational signals.

10. A system, comprising:

at least one processor; and memory containing instructions, the instructions being executable by the at least one processor to:

receive log data from event logs of one or more Supervisory Control and Data Acquisition (SCADA) systems that monitor renewable energy assets, the log data being generated during a first time period;

create cohort instances based on historical failure data, the cohort instances representing a subset of the renewable energy assets, the subset of the renewable energy assets including a same type of controller and operating in a similar geography;

create a feature matrix based on the cohort instances, wherein the feature matrix includes a unique feature identifier for any number of features of the historical failure data;

extract patterns of events from the log data based on the feature matrix;

generate a first set of failure prediction models using first historical sensor data and the patterns of events, the first historical sensor data including sensor data from one or more sensors of one or more components of the renewable energy assets, the first historical sensor data indicating at least one first failure associated with the one or more components of the renewable energy asset during the first time period, each of the first set of failure prediction models being trained using different amounts of the first historical sensor data based on different observation time windows and different lead time windows, each observation time window including a time period during which first historical sensor data is generated, the lead time window including a period of time before a predicted failure;

evaluate each of the first set of failure prediction models using at least a confusion matrix including metrics for true positives, false positives, true negatives, and false negatives as well as a positive prediction value;

compare the confusion matrix and the positive prediction value of each of the first set of failure prediction models;

select at least one failure prediction model of the first set of failure prediction models based on the comparison of the confusion matrixes, the positive prediction values, and the lead time windows;

receive first current sensor data of a second time period, the first current sensor data including sensor data from the one or more sensors of the one or more components of the renewable energy assets;

apply the selected failure prediction model to the first current sensor data to generate a first failure prediction of a failure of at least one component of the one or more components;

compare the first failure prediction to a trigger criteria;

generate a first alert based on the comparison of the first failure prediction to the trigger criteria, the first alert indicating the at least one component of the one or more components and information regarding the first failure prediction including failure type and severity, wherein different alerts are generated based on different failure types and severity levels; and transmit the first alert to one or more digital devices based on the severity, significance, and imminence of failure, thereby reducing occurrences of failure of at least a subset of the renewable energy assets being monitored by the one or more SCADA systems and prevent damage to infrastructure and power loss.

11. The system of claim 10, the instructions being executable by the at least one processor to further clean the log data, the cleaning comprising discarding event data missing expected information.

12. The system of claim 10, wherein extracting patterns of events from the log data comprises counting a number of event codes of events that occurred during a time interval using the feature matrix and sequence the event codes to include dynamics of events in a longitudinal time dimension.

13. The system of claim 12, wherein the time interval is the first time period, the first historical sensor data being generated by the one or more sensors during the first time period.

14. The system of claim 10, wherein events of the patterns of events occur during the first time period.

15. The system of claim 10, wherein the renewable energy asset is a wind turbine.

16. The system of claim 10, wherein the log data includes wind turbine component failure data.

17. The system of claim 10, the instructions being further executable by the at least one processor to: retrieve the trigger criteria from a datastore including a plurality of trigger criteria, the trigger criteria being retrieved based at least in part on the at least one component of the one or more components.

18. The system of claim 10, the instructions being further executable by the at least one processor to: receive operational signals from the one or more SCADA systems and extract features from the operational signals, wherein generating the first set of failure prediction models uses the first historical sensor data, the patterns of events, and extracted features from the operational signals.

19. A method comprising:

receiving log data from event logs of one or more Supervisory Control and Data Acquisition (SCADA) systems that monitor renewable energy assets, the log data being generated during a first time period;

creating cohort instances based on historical failure data, the cohort instances representing a subset of the renewable energy assets, the subset of the renewable energy assets including a same type of controller and operating in a similar geography;

creating a feature matrix based on the cohort instances, wherein the feature matrix includes a unique feature identifier for any number of features of the historical failure data;

extracting patterns of events from the log data based on the feature matrix;

generating a first set of failure prediction models using first historical sensor data and the patterns of events, the first historical sensor data including sensor data from one or more sensors of one or more components of the renewable energy assets, the first historical sensor data indicating at least one first failure associated with the one or more components of the renewable energy asset during the first time period, each of the first set of failure prediction models being trained using different amounts of the first historical sensor data based on different observation time windows and different lead time windows, each observation time window including a time period during which first historical data is generated, the lead time window including a period of time before a predicted failure;

evaluating each of the first set of failure prediction models using at least a confusion matrix including metrics for true positives, false positives, true negatives, and false negatives as well as a positive prediction value;

comparing the confusion matrix and the positive prediction value of each of the first set of failure prediction models;

selecting at least one failure prediction model of the first set of failure prediction models based on the comparison of the confusion matrixes, the positive prediction values, and the lead time windows;

receiving first current sensor data of a second time period, the first current sensor data including sensor data from the one or more sensors of the one or more components of the renewable energy assets;

applying the selected failure prediction model to the first current sensor data to generate a first failure prediction of a failure of at least one component of the one or more components;

comparing the first failure prediction to a trigger criteria;

generating a first alert based on the comparison of the first failure prediction to the trigger criteria, the first alert indicating the at least one component of the one or more components and information regarding the first failure prediction including failure type and severity, wherein different alerts are generated based on different failure types and severity levels; and transmitting the first alert to one or more digital devices based on the severity, significance, and imminence of failure, thereby reducing occurrences of failure of at least a subset of the renewable energy assets being monitored by the one or more SCADA systems and prevent damage to infrastructure and power loss.

* * * * *